US012684807B2

(12) United States Patent
Kimoto et al.

(10) Patent No.: US 12,684,807 B2
(45) Date of Patent: Jul. 14, 2026

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Shinichi Kimoto, Tsukuba (JP); Ryosuke Iijima, Setagaya (JP); Shinsuke Harada, Tsukuba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 613 days.

(21) Appl. No.: 17/900,993

(22) Filed: Sep. 1, 2022

(65) Prior Publication Data

US 2023/0299193 A1     Sep. 21, 2023

(30) Foreign Application Priority Data

Mar. 17, 2022    (JP) .................................. 2022-042734

(51) Int. Cl.
*H10D 30/66*          (2025.01)
*H10D 12/00*          (2025.01)
(Continued)

(52) U.S. Cl.
CPC ......... *H10D 30/668* (2025.01); *H10D 64/513* (2025.01); *H10D 64/519* (2025.01); *H10D 62/8325* (2025.01); *H10W 20/484* (2026.01)

(58) Field of Classification Search
CPC ............................. H10D 30/668; H10D 64/513
See application file for complete search history.

(56) References Cited

U.S. PATENT DOCUMENTS 6,642,090 B1 * 11/2003 Fried .................. H10D 84/0172
                                          438/164
2003/0073289 A1 * 4/2003 Curry .................. H01L 29/7397
                                          257/E21.384
(Continued)

FOREIGN PATENT DOCUMENTS

JP        2003-209122 A      7/2003
JP        2009-141149 A      6/2009
(Continued)

OTHER PUBLICATIONS

Office Action issued Sep. 30, 2025 in Japanese Patent Application No. 2022-042734, with English translation, citing documents 15-17 therein.

*Primary Examiner* — Brent A. Fairbanks
*Assistant Examiner* — Michael Anguiano
(74) *Attorney, Agent, or Firm* — Oblon, McClelland, Maier & Neustadt, L.L.P.

(57)          ABSTRACT
A semiconductor device of embodiments includes: a silicon carbide layer having a first face parallel to a first direction and a second direction crossing the first direction and a second face facing the first face; a first trench on a side of the first face extending in the first direction; a second trench extending in the first direction; a third trench extending in the second direction and continuous with the first trench and the second trench; a fourth trench extending in the first direction, disposed between the first trench and the second trench, and spaced from the third trench in the first direction; a gate electrode in the first to fourth trench; a gate insulating layer; a first conductive layer crossing the third trench and connected to the gate electrode; a first electrode disposed on the first face; and a second electrode disposed on the second face.

18 Claims, 18 Drawing Sheets

FIRST DIRECTION

(51) Int. Cl.
  *H10D 62/832*      (2025.01)
  *H10D 64/27*       (2025.01)
  *H10W 20/40*       (2026.01)

(56)          References Cited

U.S. PATENT DOCUMENTS

| | | | | |
|---|---|---|---|---|
| 2011/0294444 | A1 | 12/2011 | Kawano | |
| 2015/0349056 | A1* | 12/2015 | Jin ........................ | H10D 30/668 |
| | | | | 257/334 |
| 2017/0084727 | A1 | 3/2017 | Naito | |
| 2018/0226481 | A1* | 8/2018 | Wutte .................. | H10D 64/117 |
| 2018/0269315 | A1* | 9/2018 | Kato .................... | H10D 64/231 |
| 2018/0337275 | A1* | 11/2018 | Shimizu ............... | H10D 62/106 |
| 2019/0148541 | A1* | 5/2019 | Qin ...................... | H10D 30/668 |
| | | | | 257/330 |
| 2019/0189742 | A1* | 6/2019 | Meiser ................. | H10D 30/603 |
| 2019/0198619 | A1* | 6/2019 | Iijima .................. | H10D 62/393 |
| 2022/0190130 | A1 | 6/2022 | Kimoto et al. | |

FOREIGN PATENT DOCUMENTS

| | | | |
|---|---|---|---|
| JP | 2011-249485 | A | 12/2011 |
| JP | 5211666 | B2 | 6/2013 |
| JP | 2018-157200 | A | 10/2018 |
| JP | 2018-195782 | A | 12/2018 |
| JP | 2022-093130 | A | 6/2022 |
| WO | WO 2016/098409 | A1 | 6/2016 |

* cited by examiner

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2022-042734, filed on Mar. 17, 2022, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such physical properties, it is possible to realize a semiconductor device that can operate at high temperature with low loss.

In a vertical metal oxide semiconductor field effect transistor (MOSFET), a trench gate structure in which a gate electrode is provided in a trench is applied in order to realize a low on-resistance. By applying the trench gate structure, the channel area per unit area is increased, and accordingly, the on-resistance is reduced. By reducing a cell pitch, which is a repetition interval in the arrangement of trenches, the channel area per unit area is further increased, and accordingly, the on-resistance is further reduced. For the MOSFET having a trench gate structure, it is desired to improve the reliability.

DETAILED DESCRIPTION

Figure 1:
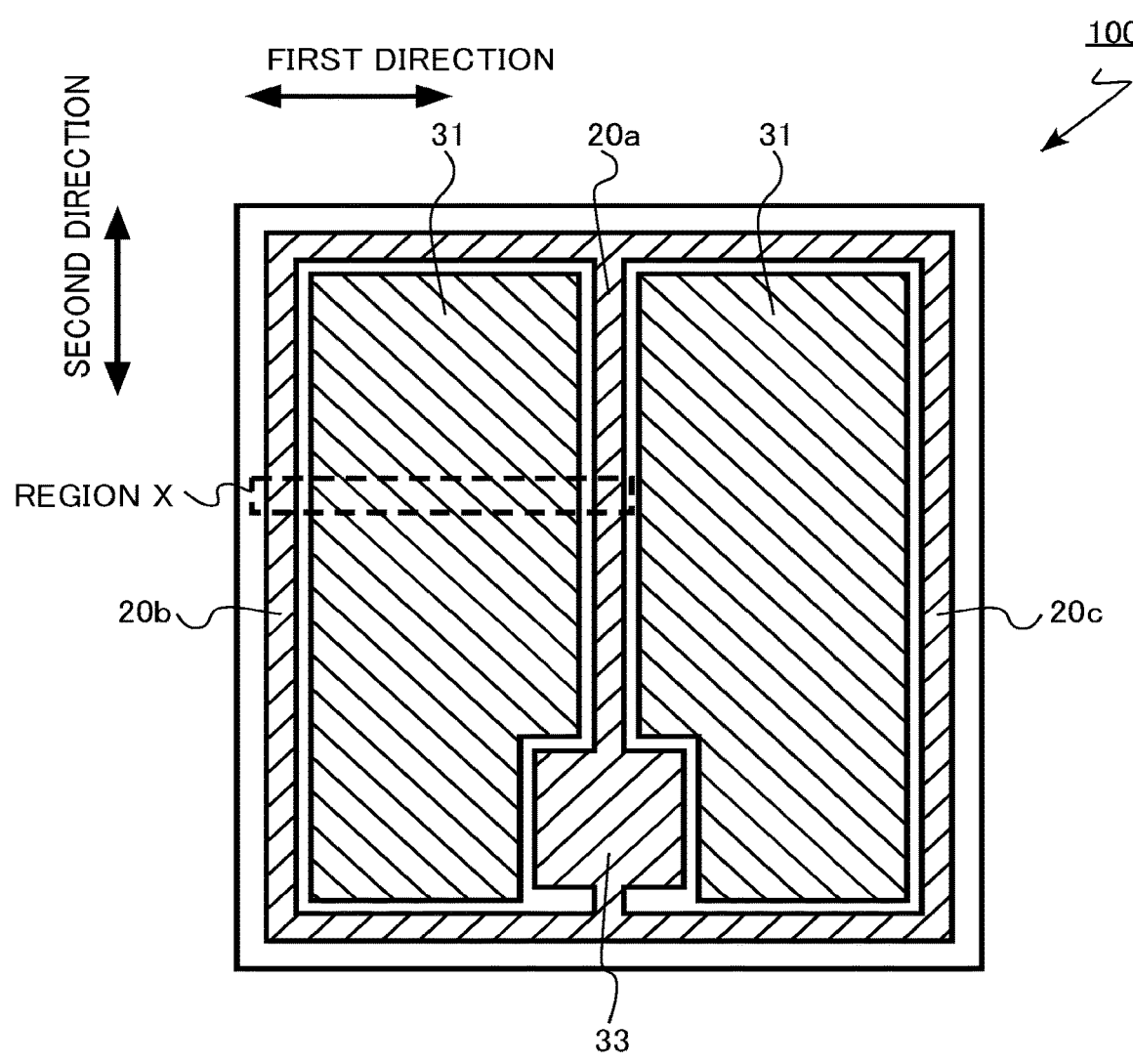
FIG. 1 is a schematic top view of a semiconductor device according to a first embodiment.

A semiconductor device of embodiments includes: a silicon carbide layer having a first face parallel to a first direction and a second direction crossing the first direction and a second face facing the first face; a first trench disposed in the silicon carbide layer, disposed on a side of the first face, and extending in the first direction; a second trench disposed in the silicon carbide layer, disposed on the side of the first face, extending in the first direction, and disposed in the second direction with respect to the first trench; a third trench disposed in the silicon carbide layer, disposed on the side of the first face, extending in the second direction, and continuous with the first trench and the second trench; a fourth trench disposed in the silicon carbide layer, disposed on the side of the first face, extending in the first direction, disposed between the first trench and the second trench, and spaced from the third trench in the first direction; a first silicon carbide region of n-type disposed in the silicon carbide layer; a second silicon carbide region of p-type disposed in the silicon carbide layer and disposed between the first silicon carbide region and the first face, a distance of the second silicon carbide region from the second face being larger than a distance from the second face to the first trench; a third silicon carbide region of n-type disposed in the silicon carbide layer and disposed between the second silicon carbide region and the first face; a gate electrode disposed in the first trench, the second trench, the third trench, and the fourth trench; a gate insulating layer disposed between the gate electrode and the silicon carbide layer; a first wiring layer disposed on the side of the first face with respect to the silicon carbide layer, disposed in the first direction with respect to the third trench, and extending in the second direction; a first conductive layer crossing the third trench, connected to the gate electrode, and is electrically connected to the first wiring layer; a first electrode disposed on the side of the first face with respect to the silicon carbide layer and electrically connected to the third silicon carbide region; and a second electrode disposed on a side of the second face with respect to the silicon carbide layer.

Hereinafter, embodiments will be described with reference to the diagrams. In the following description, the same or similar members and the like will be denoted by the same reference numerals, and the description of the members and the like once described will be omitted as appropriate.

In addition, in the following description, when the notations of n$^+$, n, n$^-$, p$^+$, p, and p$^-$ are used, these notations indicate the relative high and low of the impurity concentration in each conductive type. That is, n$^+$ indicates that the n-type impurity concentration is relatively higher than n, and n⁻ indicates that the n-type impurity concentration is relatively lower than n. In addition, p⁺ indicates that the p-type impurity concentration is relatively higher than p, and p⁻ indicates that the p-type impurity concentration is relatively lower than p. In addition, n⁺-type and n⁻-type may be simply described as n-type, p⁺-type and p⁻-type may be simply described as p-type.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of an impurity region can be calculated from, for example, an SCM image.

The sizes of the components forming the semiconductor device and the distance between the components can be measured, for example, on an image of a scanning electron microscope (SEM) or an image of a transmission electron microscope (TEM).

First Embodiment

A semiconductor device according to a first embodiment includes: a silicon carbide layer having a first face parallel to a first direction and a second direction perpendicular to the first direction and a second face facing the first face; a first trench disposed in the silicon carbide layer, disposed on a side of the first face, and extending in the first direction; a second trench disposed in the silicon carbide layer, disposed on the side of the first face, extending in the first direction, and disposed in the second direction with respect to the first trench; a third trench disposed in the silicon carbide layer, disposed on the side of the first face, extending in the second direction, and continuous with the first trench and the second trench; a fourth trench disposed in the silicon carbide layer, disposed on the side of the first face, extending in the first direction, disposed between the first trench and the second trench, and spaced from the third trench in the first direction; a first silicon carbide region of n-type disposed in the silicon carbide layer; a second silicon carbide region of p-type disposed in the silicon carbide layer and disposed between the first silicon carbide region and the first face, a distance of the second silicon carbide region from the second face being larger than a distance from the second face to the first trench; a third silicon carbide region of n-type disposed in the silicon carbide layer and disposed between the second silicon carbide region and the first face; a gate electrode disposed in the first trench, the second trench, the third trench, and the fourth trench; a gate insulating layer disposed between the gate electrode and the silicon carbide layer; a first wiring layer disposed on the side of the first face with respect to the silicon carbide layer, disposed in the first direction with respect to the third trench, and extending in the second direction; a first conductive layer crossing the third trench, connected to the gate electrode, and is electrically connected to the first wiring layer; a first electrode disposed on the side of the first face with respect to the silicon carbide layer and electrically connected to the third silicon carbide region; and a second electrode disposed on a side of the second face with respect to the silicon carbide layer.

The semiconductor device according to the first embodiment further includes: a seventh trench disposed in the silicon carbide layer, disposed on the side of the first face, and extending in the first direction, the first trench being disposed between the fourth trench and the seventh trench; an eighth trench disposed in the silicon carbide layer, disposed on the side of the first face, extending in the second direction, continuous with the fourth trench and the seventh trench, and spaced from the first trench in the first direction; a second wiring layer disposed on the side of the first face with respect to the silicon carbide layer, disposed in the first direction with respect to the eighth trench, and extending in the second direction; and a second conductive layer crossing the eighth trench, connected to the gate electrode, and electrically connected to the second wiring layer.

FIG. 1 is a schematic top view of the semiconductor device according to the first embodiment.

Figure 2:
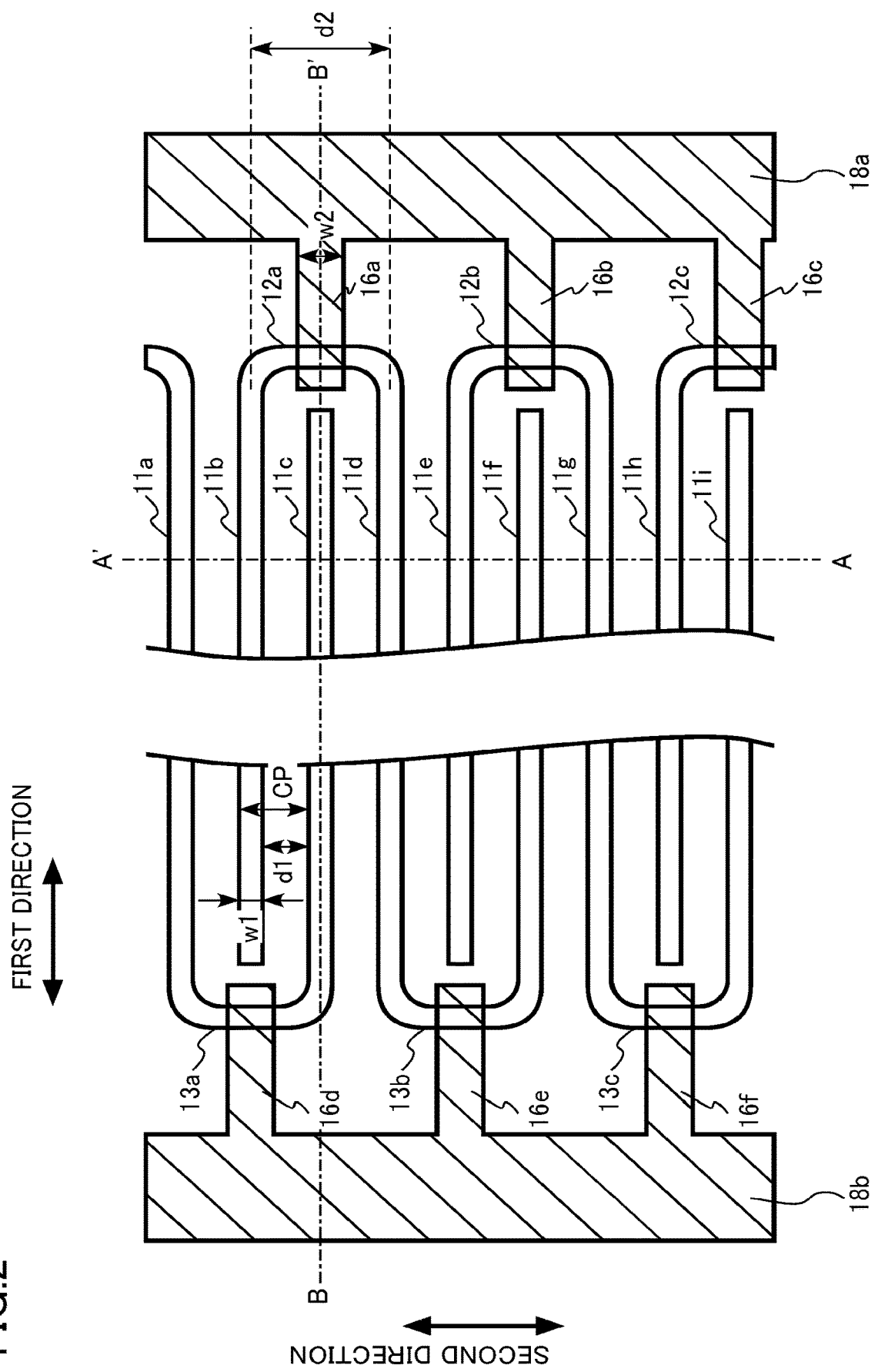
FIG. 2 is a schematic plan view of a part of the semiconductor device according to the first embodiment.

FIG. 2 is a schematic plan view of a part of the semiconductor device according to the first embodiment. FIG. 2 is a plan view of a region X in FIG. 1. In FIG. 2, a central portion of the region X is not shown. The first direction and the second direction cross each other. For example, the first direction and the second direction are perpendicular to each other. The third direction crosses a plane including the first direction and the second direction. For example, the third direction is perpendicular to a plane including the first direction and the second direction.

Figure 3:
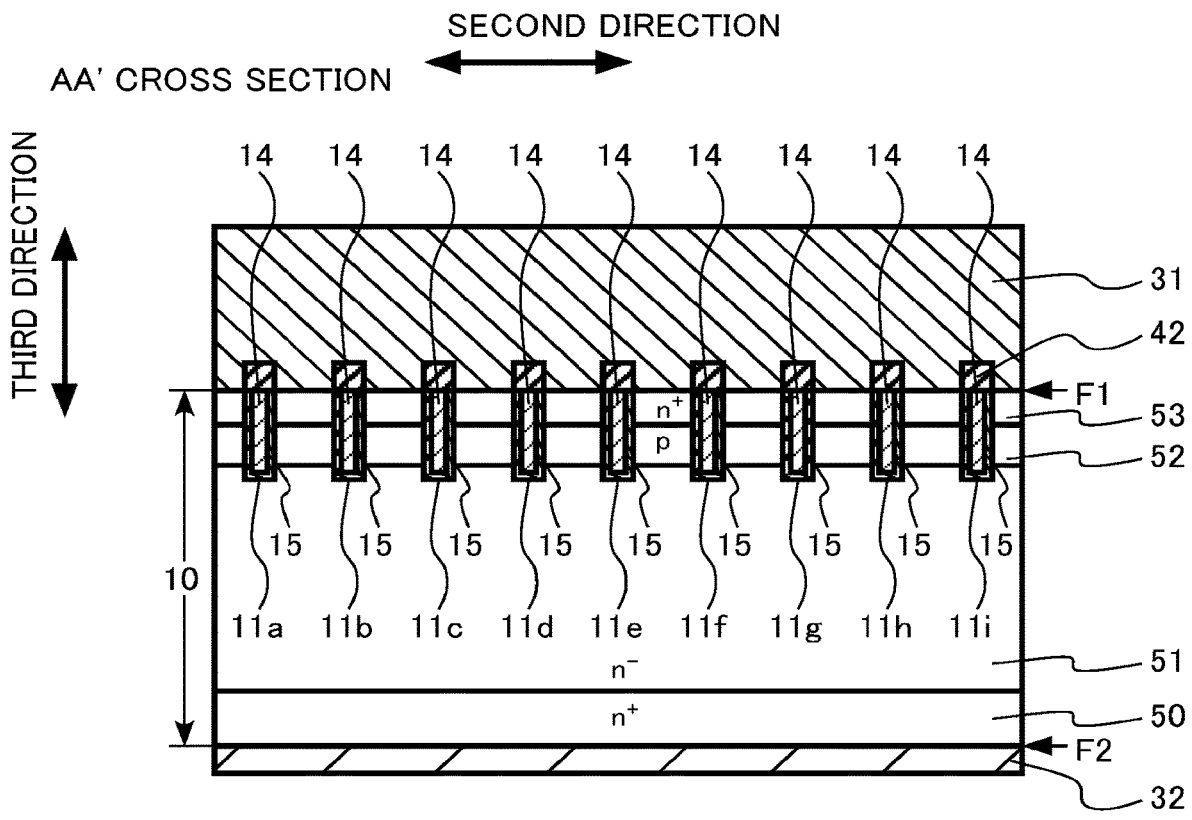
FIG. 3 is a schematic cross-sectional view of a part of the semiconductor device according to the first embodiment.

FIG. 3 is a schematic cross-sectional view of a part of the semiconductor device according to the first embodiment. FIG. 3 is a cross-sectional view taken along the line AA' of FIG. 2.

Figure 4:
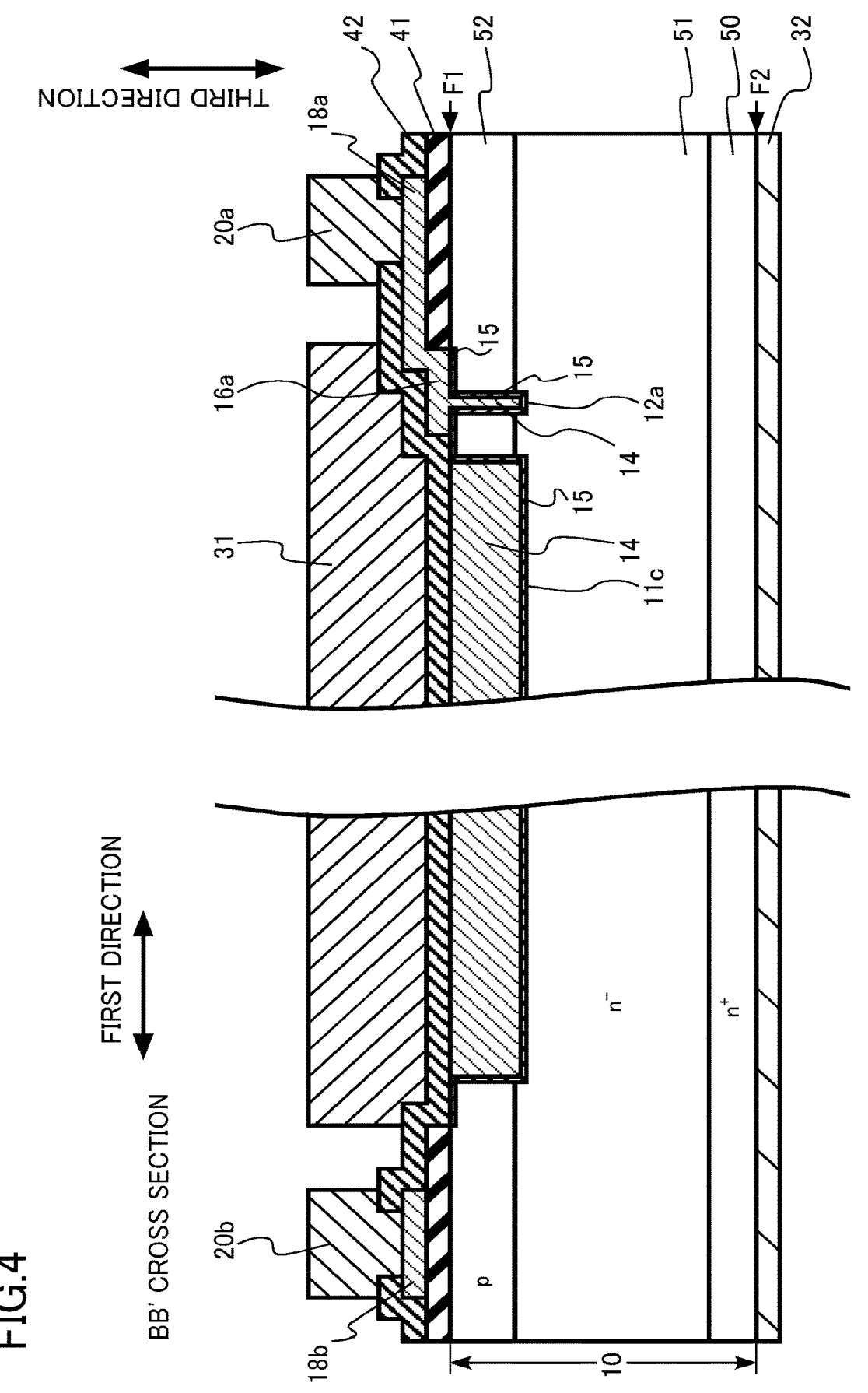
FIG. 4 is a schematic cross-sectional view of a part of the semiconductor device according to the first embodiment.

FIG. 4 is a schematic cross-sectional view of a part of the semiconductor device according to the first embodiment. FIG. 4 is a cross-sectional view taken along the line BB' of FIG. 2.

The semiconductor device according to the first embodiment is a trench gate type vertical MOSFET 100 using silicon carbide. The MOSFET 100 is an n-channel MOSFET having electrons as carriers.

A MOSFET 100 includes a silicon carbide layer 10, a first gate trench 11a (seventh trench), a second gate trench 11b (first trench), a third gate trench 11c (fourth trench), and a fourth gate trench 11d (second trench), a fifth gate trench 11e, a sixth gate trench 11f, a seventh gate trench 11g, an eighth gate trench 11h, a ninth gate trench 11i, a first right connection trench 12a (third trench), a second right connection trench 12b, a third right connection trench 12c, a first left connection trench 13a (eighth trench), a second left connection trench 13b, a third left connection trench 13c, a gate electrode 14, a gate insulating layer 15, a first gate lead-out layer 16a (first conductive layer), a second gate lead-out layer 16b, a third gate lead-out layer 16c, a fourth gate lead-out layer 16d (second conductive layer), a fifth gate lead-out layer 16e, a sixth gate lead-out layer 16f, a first gate wiring layer 18a (first wiring layer), a second gate wiring layer 18b (second wiring layer), a first gate metal wiring 20a, a second gate metal wiring 20b, a third gate metal wiring 20c, a source electrode 31 (first electrode), a drain electrode 32 (second electrode), a gate electrode pad 33, a field insulating layer 41, and an interlayer insulating layer 42.

Hereinafter, the first gate trench 11a to the ninth gate trench 11i may be collectively referred to as a gate trench 11. In addition, the first right connection trench 12a, the second right connection trench 12b, and the third right connection trench 12c may be collectively referred to as a right connection trench 12. In addition, the first left connection trench 13a, the second left connection trench 13b, and the third left connection trench 13c may be collectively referred to as a left connection trench 13. In addition, the first gate lead-out layer 16*a*, the second gate lead-out layer 16*b*, the third gate lead-out layer 16*c*, the fourth gate lead-out layer 16*d*, the fifth gate lead-out layer 16*e*, and the sixth gate lead-out layer 16*f* may be collectively referred to as a gate lead-out layer 16. In addition, the first gate wiring layer 18*a* and the second gate wiring layer 18*b* may be collectively referred to as a gate wiring layer 18. In addition, the first gate metal wiring 20*a*, the second gate metal wiring 20*b*, and the third gate metal wiring 20*c* may be collectively referred to as a gate metal wiring 20.

An n$^+$-type drain region 50, an n$^-$-type drift region 51 (first silicon carbide region), a p-type body region 52 (second silicon carbide region), and an n$^+$-type source region 53 (third silicon carbide region) are provided in the silicon carbide layer 10.

As shown in FIG. 1, the first gate metal wiring 20*a*, the second gate metal wiring 20*b*, the third gate metal wiring 20*c*, the source electrode 31, and the gate electrode pad 33 are provided on the upper surface of the MOSFET 100. For example, the first gate metal wiring 20*a*, the second gate metal wiring 20*b*, the third gate metal wiring 20*c*, the source electrode 31, and the gate electrode pad 33 are simultaneously formed of the same material.

The first gate metal wiring 20*a*, the second gate metal wiring 20*b*, and the third gate metal wiring 20*c* are connected to the gate electrode pad 33. The first gate metal wiring 20*a*, the second gate metal wiring 20*b*, and the third gate metal wiring 20*c* extend in the second direction. The source electrode 31 is disposed between the first gate metal wiring 20*a* and the second gate metal wiring 20*b*. In addition, the source electrode 31 is disposed between the first gate metal wiring 20*a* and the third gate metal wiring 20*c*.

The gate electrode pad 33 is electrically connected to the gate metal wiring 20, the gate wiring layer 18, the gate lead-out layer 16, and the gate electrode 14. By applying a gate voltage to the gate electrode pad 33, the gate voltage is applied to the gate electrode 14.

The silicon carbide layer 10 is a single crystal SiC. The silicon carbide layer 10 is, for example, 4H-SiC.

The silicon carbide layer 10 includes a first face ("F1" in FIGS. 3 and 4) and a second face ("F2" in FIGS. 3 and 4). The first face F1 and the second face F2 face each other. Hereinafter, the first face F1 is also referred to as a surface, and the second face F2 is also referred to as a back surface. In addition, hereinafter, the "depth" means a depth in a direction toward the second face F2 with the first face F1 as a reference.

The first face F1 and the second face F2 are parallel to the first direction and the second direction. The second direction is perpendicular to the first direction.

The first face F1 is, for example, a face inclined by an angle equal to or more than 0° and equal to or less than 8° with respect to the (0001) face. That is, the first face F1 is a face whose normal is inclined by an angle equal to or more than 0° and equal to or less than 8° with respect to the c axis in the direction. In other words, an off angle with respect to the (0001) face is equal to or more than 0° and equal to or less than 8°. In addition, the second face F2 is, for example, a face inclined by an angle equal to or more than 0° and equal to or less than 8° with respect to the (000-1) face.

The (0001) face is referred to as a silicon face. The (000-1) face is referred to as a carbon face. The inclination direction of the first face F1 and the second face F2 is, for example, a [11-20] direction. The [11-20] direction is an a-axis direction. In FIG. 2, for example, the first direction shown in the diagram is the a-axis direction.

FIG. 2 shows the patterns of the gate trench 11, the right connection trench 12, and the left connection trench 13 on the first face F1. In addition, FIG. 2 shows the patterns of the gate lead-out layer 16 and the gate wiring layer 18.

The first gate trench 11*a* (seventh trench), the second gate trench 11*b* (first trench), the third gate trench 11*c* (fourth trench), the fourth gate trench 11*d* (second trench), the fifth gate trench 11*e*, the sixth gate trench 11*f*, the seventh gate trench 11*g*, the eighth gate trench 11*h*, and the ninth gate trench 11*i* are disposed in the silicon carbide layer 10. The gate trench 11 extends in the first direction.

The gate trench 11 is repeatedly arranged at a predetermined cell pitch (CP in FIG. 2) in the second direction. The cell pitch CP is equal to the sum of the width of the gate trench 11 in the second direction and the distance between the adjacent gate trenches 11 in the second direction.

The cell pitch CP is, for example, equal to or less than 2 μm. The sum of the width of the gate trench 11 in the second direction and the distance between the adjacent gate trenches 11 in the second direction is, for example, equal to or less than 2 μm. For example, the sum of the width (w1 in FIG. 2) of the second gate trench 11*b* in the second direction and the distance (d1 in FIG. 2) between the second gate trench 11*b* (first trench) and the third gate trench 11*c* (fourth trench) is equal to or less than 2 μm.

The width of the gate trench 11 in the second direction is, for example, equal to or more than 0.3 μm and equal to or less than 1 μm. The distance between the adjacent gate trenches 11 in the second direction is, for example, equal to or more than 0.5 μm and equal to or less than 1.5 μm.

The third gate trench 11*c* (fourth trench) is disposed between the second gate trench 11*b* (first trench) and the fourth gate trench 11*d* (second trench). The second gate trench 11*b* (first trench) is disposed between the first gate trench 11*a* (seventh trench) and the third gate trench 11*c* (fourth trench).

The first right connection trench 12*a* (third trench), the second right connection trench 12*b*, and the third right connection trench 12*c* are disposed in the silicon carbide layer 10. The right connection trench 12 is provided on the first gate metal wiring 20*a* side of the region X (FIG. 1).

The right connection trench 12 extends in the second direction. The right connection trench 12 is continuous with the two gate trenches 11. The right connection trench 12 connects the ends of the two gate trenches 11 to each other. The right connection trenches 12 are spaced from each other in the second direction.

One gate trench 11 is provided between the two gate trenches 11 connected to each other by the right connection trench 12. The gate trench 11 provided between the two gate trenches 11 and the right connection trench 12 are spaced from each other in the first direction.

For example, the first right connection trench 12*a* (third trench) is continuous with the second gate trench 11*b* (first trench) and the fourth gate trench 11*d* (second trench). The first right connection trench 12*a* connects the second gate trench 11*b* and the fourth gate trench 11*d* to each other.

The third gate trench 11*c* (fourth trench) is disposed between the second gate trench 11*b* (first trench) and the fourth gate trench 11*d* (second trench). The third gate trench 11*c* is spaced from the first right connection trench 12*a* in the first direction.

The length of the right connection trench 12 in the second direction is twice the cell pitch CP. In addition, the length d2 of the right connection trench 12 in the second direction is defined as a distance between the center lines of the two gate trenches 11, which are connected to each other by the right connection trench 12, in the second direction.

For example, the length (d2 in FIG. 2) of the first right connection trench 12a (third trench) in the second direction is twice the cell pitch CP.

The first left connection trench 13a (eighth trench), the second left connection trench 13b, and the third left connection trench 13c are disposed in the silicon carbide layer 10. The left connection trench 13 is provided on the second gate metal wiring 20b side of the region X.

The left connection trench 13 extends in the second direction. The left connection trench 13 is continuous with the two gate trenches 11. The left connection trench 13 connects the ends of the two gate trenches 11 to each other. The left connection trenches 13 are spaced from each other in the second direction.

One gate trench 11 is provided between the two gate trenches 11 connected to each other by the left connection trench 13. The gate trench 11 provided between the two gate trenches 11 and the left connection trench 13 are spaced from each other in the first direction.

For example, the first left connection trench 13a (eighth trench) is continuous with the first gate trench 11a (seventh trench) and the third gate trench 11c (fourth trench). The first left connection trench 13a connects the first gate trench 11a and the third gate trench 11c to each other.

The second gate trench 11b (first trench) is disposed between the first gate trench 11a (seventh trench) and the third gate trench 11c (fourth trench). The second gate trench 11b is spaced from the first left connection trench 13a in the first direction.

The length of the left connection trench 13 in the second direction is twice the cell pitch CP. The length of the first left connection trench 13a (eighth trench) in the second direction is twice the cell pitch CP.

The $n^+$-type drain region 50 is disposed in the silicon carbide layer 10. The drain region 50 is provided on the second face F2 side of the silicon carbide layer 10. The drain region 50 contains, for example, nitrogen (N) as an n-type impurity. The n-type impurity concentration in the drain region 50 is, for example, equal to or more than $1\times10^{18}$ cm$^{-3}$ and equal to or less than $1\times10^{21}$ cm$^{-3}$.

The $n^-$-type drift region 51 is disposed in the silicon carbide layer 10. The drift region 51 is provided on the drain region 50. The drift region 51 is provided between the drain region 50 and the first face F1 of the silicon carbide layer 10.

The drift region 51 contains, for example, nitrogen (N) as an n-type impurity. The n-type impurity concentration in the drift region 51 is, for example, equal to or more than $4\times10^{14}$ cm$^{-3}$ and equal to or less than $1\times10^{18}$ cm$^{-3}$.

The p-type body region 52 is disposed in the silicon carbide layer 10. The body region 52 is provided between the drift region 51 and the first face F1 of the silicon carbide layer 10.

The distance from the second face F2 to the body region 52 is larger than the distance from the second face F2 to the gate trench 11. In other words, the depth of the body region 52 from the first face F1 is smaller than the depth of the gate trench 11 from the first face F1.

The body region 52 functions as a channel region of the MOSFET 100. For example, when the MOSFET 100 is turned on, a channel through which electrons flow is formed in a region of the body region 52 in contact with the gate insulating layer.

The body region 52 contains, for example, aluminum (Al) as a p-type impurity. The p-type impurity concentration in the body region 52 is, for example, equal to or more than $5\times10^{16}$ cm$^{-3}$ and equal to or less than $5\times10^{17}$ cm$^{-3}$.

The $n^+$-type source region 53 is disposed in the silicon carbide layer 10. The source region 53 is provided between the body region 52 and the first face F1 of the silicon carbide layer 10. The source region 53 is in contact with the source electrode 31.

The source region 53 contains, for example, phosphorus (P) as an n-type impurity. The n-type impurity concentration in the source region 53 is, for example, equal to or more than $1\times10^{19}$ cm$^{-3}$ and equal to or less than $1\times10^{21}$ cm$^{-3}$.

The gate electrode 14 is disposed in the gate trench 11, the right connection trench 12, and the left connection trench 13. For example, the gate electrode 14 is disposed in the first gate trench 11a (seventh trench), the second gate trench 11b (first trench), the third gate trench 11c (fourth trench), the fourth gate trench 11d (second trench), the first right connection trench 12a (third trench), and the first left connection trench 13a (eighth trench).

The gate electrode 14 is provided between the source electrode 31 and the drain electrode 32.

The gate electrode 14 is a conductive layer. The gate electrode 14 contains, for example, polycrystalline silicon containing p-type impurities or n-type impurities. For example, the gate electrode 14 is polycrystalline silicon containing p-type impurities or n-type impurities.

The gate insulating layer 15 is disposed between the gate electrode 14 and the silicon carbide layer 10. For example, the gate insulating layer 15 is disposed between the gate lead-out layer 16 and the silicon carbide layer 10. For example, the gate insulating layer 15 is disposed between the first gate lead-out layer 16a and the silicon carbide layer 10.

The gate insulating layer 15 is, for example, a silicon oxide film. For example, a High-k insulating film (high dielectric constant insulating film such as HfSiON, ZrSiON, and AlON) can be applied to the gate insulating layer 15. In addition, for example, a stacked film of a silicon oxide film (SiO$_2$) and a High-k insulating film can be applied to the gate insulating layer 15.

The first gate wiring layer 18a is provided between the first gate metal wiring 20a and the silicon carbide layer 10 in the third direction. The first gate wiring layer 18a is electrically connected to the first gate metal wiring 20a. The first gate wiring layer 18a extends in the second direction.

The second gate wiring layer 18b is provided between the second gate metal wiring 20b and the silicon carbide layer 10 in the third direction. The second gate wiring layer 18b is electrically connected to the second gate metal wiring 20b. The second gate wiring layer 18b extends in the second direction.

The gate wiring layer 18 is a conductive layer. The gate wiring layer 18 contains, for example, polycrystalline silicon containing p-type impurities or n-type impurities. For example, the gate wiring layer 18 is polycrystalline silicon containing p-type impurities or n-type impurities.

The gate wiring layer 18 contains, for example, the same material as the gate electrode 14.

The field insulating layer 41 is provided between the first gate wiring layer 18a and the silicon carbide layer 10 in the third direction. The field insulating layer 41 is provided between the second gate wiring layer 18b and the silicon carbide layer 10. The field insulating layer 41 is, for example, a silicon oxide film.

The interlayer insulating layer 42 is provided on the gate electrode 14, on the gate lead-out layer 16, and on the gate wiring layer 18 in the third direction. For example, the interlayer insulating layer 42 is provided between the gate electrode 14 and the source electrode 31 in the third direction, between the gate lead-out layer 16 and the source electrode 31 in the third direction, and between the gate wiring layer 18 and the gate metal wiring 20 in the third direction. The interlayer insulating layer 42 is, for example, a silicon oxide film.

The source electrode 31 is disposed on the first face F1 side with respect to the silicon carbide layer 10. The source electrode 31 is in contact with the source region 53.

The source electrode 31 contains metal. The metal forming the source electrode 31 is, for example, a stacked structure of titanium (Ti) and aluminum (Al). The source electrode 31 may include a metal silicide or a metal carbide in contact with the silicon carbide layer 10.

The drain electrode 32 is disposed on the second face F2 side with respect to the silicon carbide layer 10. The drain electrode 32 is in contact with the drain region 50.

The drain electrode 32 is, for example, a metal or a metal semiconductor compound. The drain electrode 32 contains, for example, a material selected from the group consisting of nickel silicide (NiSi), titanium (Ti), nickel (Ni), silver (Ag), and gold (Au).

The gate lead-out layer 16 is disposed on the first face F1 side with respect to the silicon carbide layer 10. As shown in FIG. 2, the gate lead-out layer 16 crosses the right connection trench 12 or the left connection trench 13.

For example, the first gate lead-out layer 16*a* (first conductive layer) crosses the first right connection trench 12*a* (third trench). In addition, for example, the fourth gate lead-out layer 16*d* (second conductive layer) crosses the first left connection trench 13*a* (eighth trench).

The gate lead-out layer 16 is electrically and physically connected to the gate electrode 14. For example, the first gate lead-out layer 16*a* (first conductive layer) is electrically and physically connected to the gate electrode 14. In addition, the fourth gate lead-out layer 16*d* (second conductive layer) is electrically and physically connected to the gate electrode 14.

The gate lead-out layer 16 is electrically connected to the gate wiring layer 18. For example, the gate lead-out layer 16 is physically connected to the gate wiring layer 18.

For example, the first gate lead-out layer 16*a* (first conductive layer), the second gate lead-out layer 16*b*, and the third gate lead-out layer 16*c* are electrically connected to the first gate wiring layer 18*a*. For example, the first gate lead-out layer 16*a* (first conductive layer), the second gate lead-out layer 16*b*, and the third gate lead-out layer 16*c* are physically connected to the first gate wiring layer 18*a*.

For example, the fourth gate lead-out layer 16*d* (second conductive layer), the fifth gate lead-out layer 16*e*, and the sixth gate lead-out layer 16*f* are electrically connected to the second gate wiring layer 18*b*. For example, the fourth gate lead-out layer 16*d*, the fifth gate lead-out layer 16*e*, and the sixth gate lead-out layer 16*f* are physically connected to the second gate wiring layer 18*b*.

The gate lead-out layer 16 is a conductive layer. The gate lead-out layer 16 contains, for example, polycrystalline silicon containing p-type impurities or n-type impurities. For example, the gate lead-out layer 16 is polycrystalline silicon containing p-type impurities or n-type impurities.

The gate lead-out layer 16 contains, for example, the same material as the gate electrode 14. The gate lead-out layer 16 contains, for example, the same material as the gate wiring layer 18.

The width of the gate lead-out layer 16 in the second direction is smaller than, for example, the length of the right connection trench 12 in the second direction. The width of the gate lead-out layer 16 in the second direction is smaller than, for example, the length of the left connection trench 13 in the second direction. The width of the gate lead-out layer 16 in the second direction is smaller than, for example, the cell pitch CP.

For example, the width (w2 in FIG. 2) of the first gate lead-out layer 16*a* in the second direction is smaller than the length (d2 in FIG. 2) of the first right connection trench 12*a* in the second direction. The width (w2 in FIG. 2) of the first gate lead-out layer 16*a* in the second direction is smaller than, for example, the cell pitch CP.

The fourth gate lead-out layer 16*d*, the fifth gate lead-out layer 16*e*, and the sixth gate lead-out layer 16*f* connected to the second gate wiring layer 18*b* are arranged so as to be shifted by the cell pitch CP in the second direction with respect to the first gate lead-out layer 16*a*, the second gate lead-out layer 16*b*, and the third gate lead-out layer 16*c* connected to the first gate wiring layer 18*a*.

Figure 5:
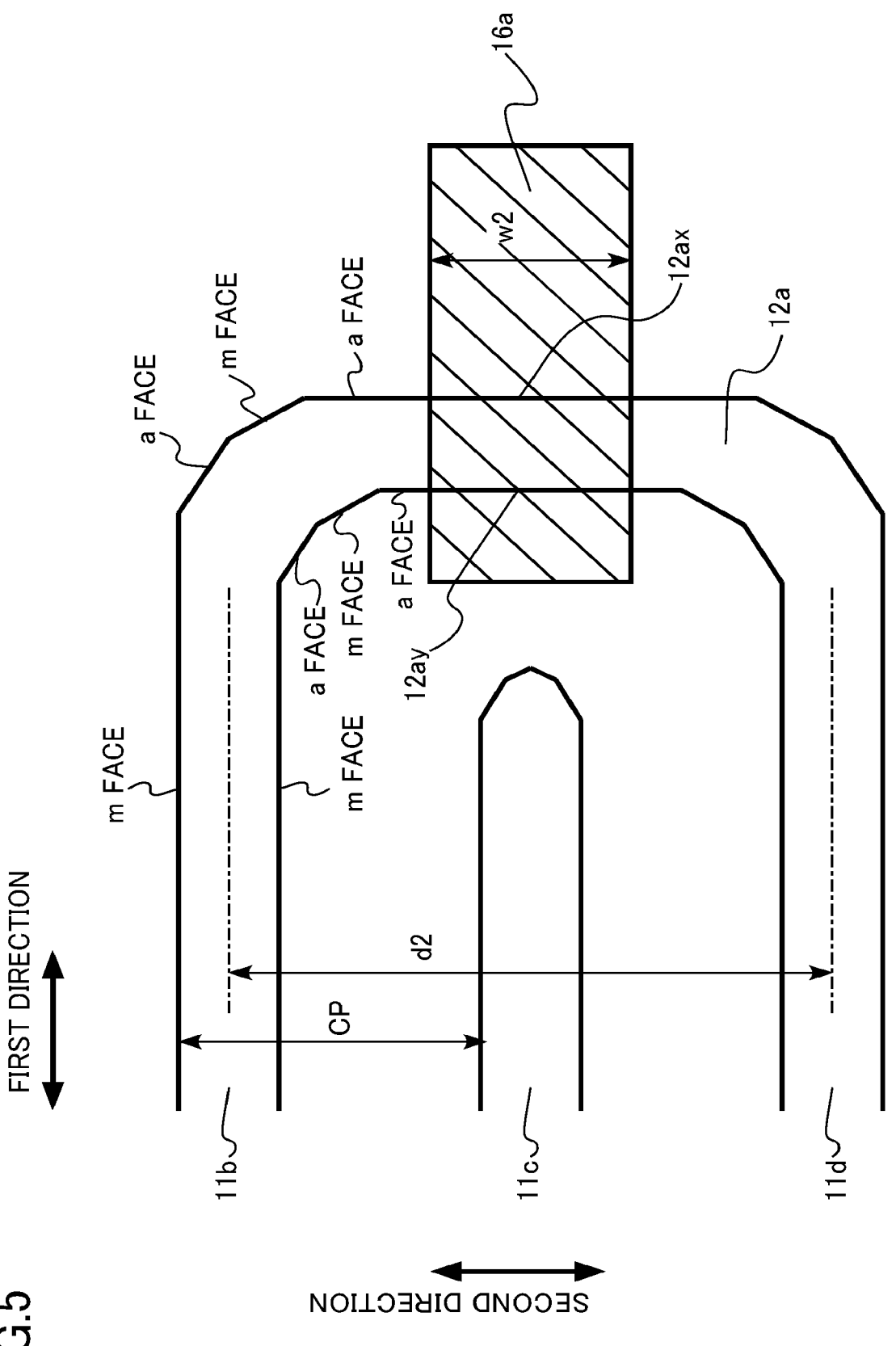
FIG. 5 is a schematic plan view of a part of the semiconductor device according to the first embodiment.

FIG. 5 is a schematic plan view of a part of the semiconductor device according to the first embodiment. FIG. 5 is an enlarged plan view of a part of FIG. 2.

FIG. 5 shows the shapes of the second gate trench 11*b*, the third gate trench 11*c*, the fourth gate trench 11*d*, and the first right connection trench 12*a* on the first face F1. In addition, FIG. 5 shows the pattern of the first gate lead-out layer 16*a*.

As shown in FIG. 5, for example, at the corner where the second gate trench 11*b* and the first right connection trench 12*a* cross each other, a specific crystal face of silicon carbide appears on the side surface of the trench. For example, when the side surface of the second gate trench 11*b* is an m-face and the side surface of the first right connection trench 12*a* is an a-face, the a-face and the m-face appear alternately at the corner. After forming the trench, a specific crystal face appears on the side surface of the trench when hydrogen annealing is performed to control the surface shape of the trench.

In the MOSFET 100 according to the first embodiment, the gate lead-out layer 16 does not cross the corner where the face of the gate trench 11 and the face of the right connection trench 12 cross each other, for example. For example, the first gate lead-out layer 16*a* does not cross the corner where the face of the second gate trench 11*b* and the face of the first right connection trench 12*a* cross each other. The first gate lead-out layer 16*a* does not cross the corner where the face of the fourth gate trench 11*d* and the face of the first right connection trench 12*a* cross each other.

In addition, for example, the shape of the right connection trench 12 crossing the gate lead-out layer 16 on the first face F1 is a linear shape. For example, the shapes of an outer side surface 12*ax* and an inner side surface 12*ay* of the first right connection trench 12*a* crossing the first gate lead-out layer 16*a* on the first face F1 are linear shapes.

In addition, for example, the side surface of the right connection trench 12 crossing the gate lead-out layer 16 is formed by a face having a single face orientation. For example, the side surface of the right connection trench 12 crossing the gate lead-out layer 16 is formed by the a-face or the m-face.

For example, the outer side surface 12*ax* and the inner side surface 12*ay* of the first right connection trench 12*a* crossing the first gate lead-out layer 16*a* are formed by the a-face or the m-face. For example, the outer side surface 12*ax* and the inner side surface 12*ay* are formed only by the a-face. For example, the outer side surface 12*ax* and the inner side surface 12*ay* are formed only by the m-face.

Next, the function and effect of the semiconductor device according to the first embodiment will be described.

A trench gate structure in which the gate electrode 14 is provided in the gate trench 11 is applied to the MOSFET 100 according to the first embodiment. By applying the trench gate structure, the channel area per unit area is increased, and accordingly, the on-resistance of the MOSFET 100 is reduced.

According to the studies by the inventors, it has been clarified that the reliability of the gate insulating layer is reduced when the gate lead-out layer for pulling out the gate electrode from the gate trench crosses the corner where the faces of the two trenches cross each other. According to the MOSFET 100 of the first embodiment, by setting the lengths of the right connection trench 12 and the left connection trench 13 in the second direction to twice the cell pitch CP, it is possible to prevent the gate lead-out layer 16 from crossing the corner where the faces of the two trenches cross each other. Therefore, the reliability of the gate insulating layer is improved. The details will be described below.

Figure 6:
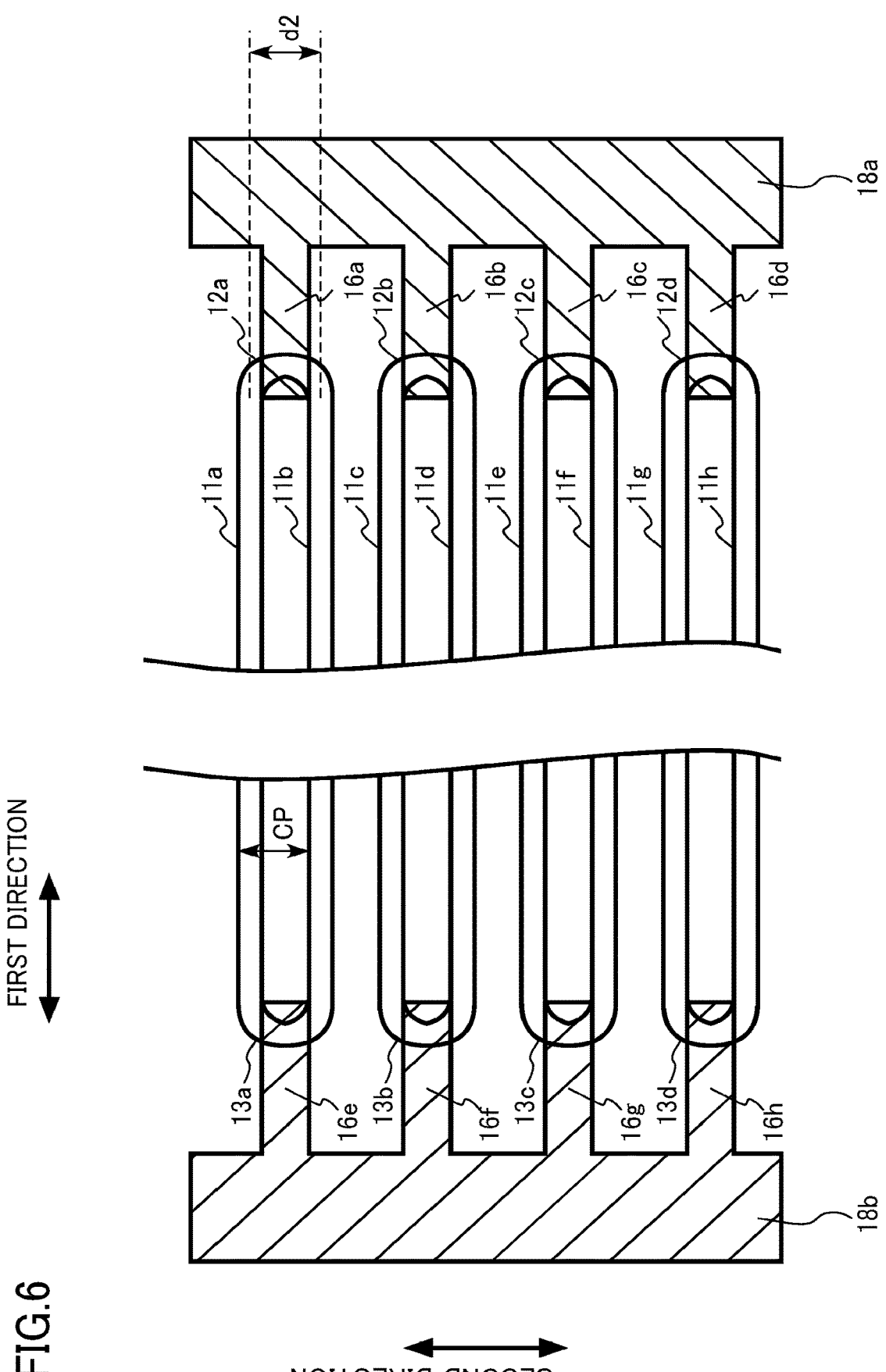
FIG. 6 is a schematic plan view of a part of a semiconductor device of a comparative example.

FIG. 6 is a schematic plan view of a part of a semiconductor device of a comparative example. FIG. 6 is a diagram corresponding to FIG. 2 of the first embodiment.

A MOSFET of the comparative example includes a first gate trench 11a, a second gate trench 11b, a third gate trench 11c, a fourth gate trench 11d, a fifth gate trench 11e, a sixth gate trench 11f, and a seventh gate trench 11g, an eighth gate trench 11h, a first right connection trench 12a, a second right connection trench 12b, a third right connection trench 12c, a fourth right connection trench 12d, a first left connection trench 13a, a second left connection trench 13b, a third left connection trench 13c, a fourth left connection trench 13d, a first gate lead-out layer 16a, a second gate lead-out layer 16b, a third gate lead-out layer 16c, a fourth gate lead-out layer 16d, a fifth gate lead-out layer 16e, a sixth gate lead-out layer 16f, a seventh gate lead-out layer 16g, an eighth gate lead-out layer 16h, a first gate wiring layer 18a, and a second gate wiring layer 18b.

The MOSFET of the comparative example is different from the MOSFET 100 according to the first embodiment in that another gate trench 11 is not disposed between the two gate trenches 11 connected to each other. The MOSFET of the comparative example is different from the MOSFET 100 according to the first embodiment in that the lengths of the right connection trench 12 and the left connection trench 13 in the second direction are the same as the cell pitch CP. In the MOSFET of the comparative example, for example, the length (d2 in FIG. 6) of the first right connection trench 12a in the second direction is the same as the cell pitch CP.

Figure 7:
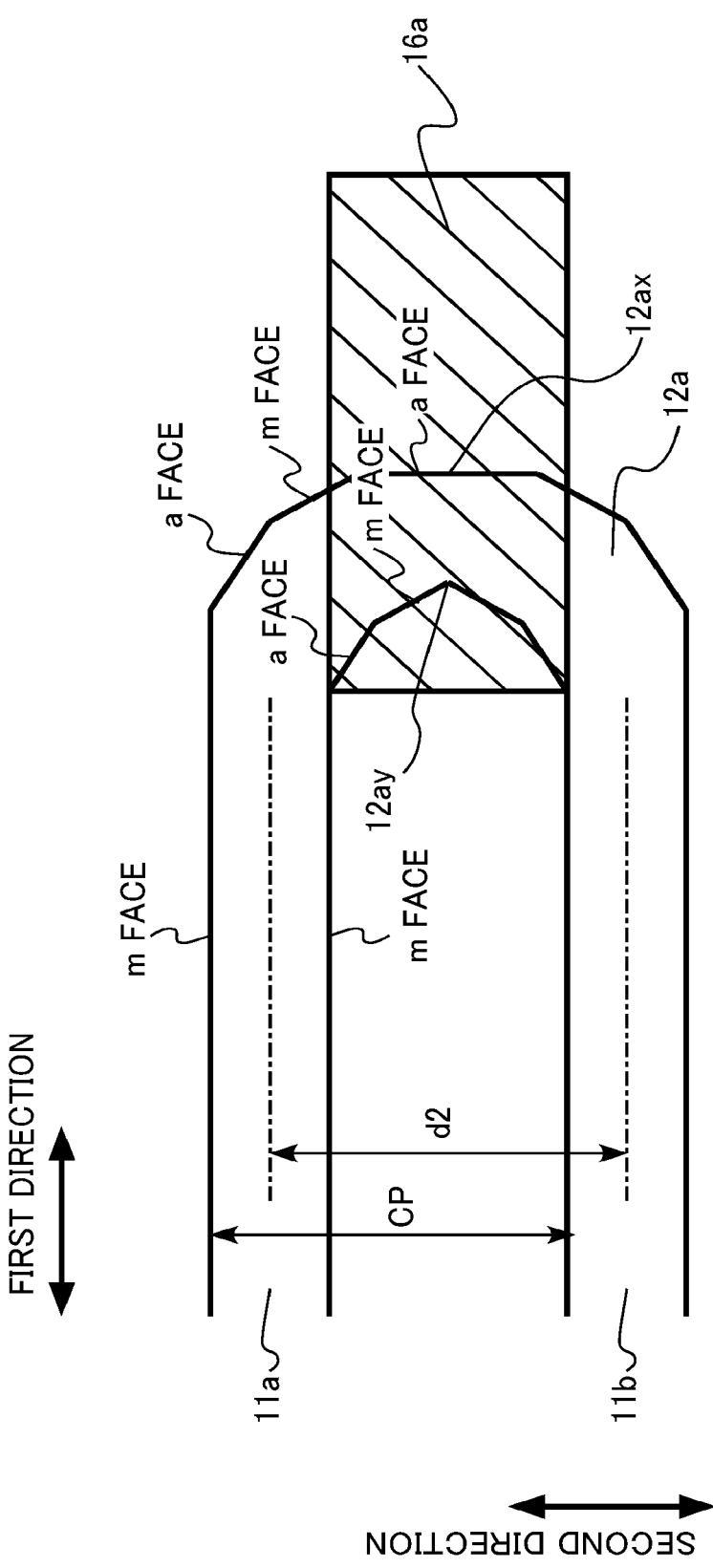
FIG. 7 is a schematic plan view of a part of a semiconductor device of a comparative example.

FIG. 7 is a schematic plan view of a part of a semiconductor device of a comparative example. FIG. 7 is an enlarged plan view of a part of FIG. 6.

FIG. 7 shows the shapes of the first gate trench 11a, the second gate trench 11b, and the first right connection trench 12a on the first face F1. In addition, FIG. 7 shows the pattern of the first gate lead-out layer 16a.

In the MOSFET of the comparative example, since the lengths of the right connection trench 12 and the left connection trench 13 in the second direction are the same as the cell pitch CP, the gate lead-out layer 16 is likely to cross the corner where the gate trench 11 and the right connection trench 12 cross each other. In particular, as the cell pitch CP becomes smaller, the gate lead-out layer 16 is more likely to cross the corner where the gate trench 11 and the right connection trench 12 cross each other.

For example, as shown in FIG. 7, the first gate lead-out layer 16a crosses the corner where the first gate trench 11a and the first right connection trench 12a cross each other and the corner where the second gate trench 11b and the first right connection trench 12a cross each other.

In addition, for example, the shape of the right connection trench 12 crossing the gate lead-out layer 16 on the first face F1 is not a linear shape but a curved shape or a bent shape. For example, the shapes of the outer side surface 12ax and the inner side surface 12ay of the first right connection trench 12a crossing the first gate lead-out layer 16a on the first face F1 are not linear shapes but curved shapes or bent shapes.

In addition, for example, the side surface of the right connection trench 12 crossing the gate lead-out layer 16 is formed by faces having a plurality of face orientations. For example, the outer side surface 12ax and the inner side surface 12ay of the first right connection trench 12a crossing the first gate lead-out layer 16a are formed by the a-face and the m-face.

According to the studies by the inventors, it has been clarified that the reliability of the gate insulating layer 15 is reduced at a portion where the gate lead-out layer 16 crosses the corner where the gate trench 11 and the right connection trench 12 cross each other. It is considered that the reason is that the shape of the gate trench 11 on the first face F1 is a curved shape or a bent shape and accordingly, the gate insulating layer 15 is thin at the upper end of the gate trench 11. Alternatively, it is considered that the electric field is likely to be concentrated at the upper end of the gate trench 11.

For example, even if the lengths of the right connection trench 12 and the left connection trench 13 in the second direction are the same as the cell pitch CP, the gate lead-out layer 16 can be separated from the corner where the gate trench 11 and the right connection trench 12 cross each other by increasing the cell pitch CP. However, increasing the cell pitch CP is not preferable because the channel area per unit area decreases and the on-resistance of the MOSFET increases.

In the MOSFET 100 according to the first embodiment, another gate trench 11 is disposed between the two gate trenches 11 connected to each other. In the MOSFET 100, the lengths of the right connection trench 12 and the left connection trench 13 in the second direction are twice the cell pitch CP.

Therefore, the gate lead-out layer 16 and the corner where the gate trench 11 and the right connection trench 12 cross each other are less likely to cross each other. In addition, the gate lead-out layer 16 and the corner where the gate trench 11 and the left connection trench 13 cross each other are less likely to cross each other. Therefore, the reliability of the gate insulating layer 15 is improved as compared with the MOSFET of the comparative example. In addition, by reducing the cell pitch CP, the on-resistance of the MOSFET 100 can be reduced.

From the viewpoint of reducing the on-resistance of the MOSFET 100, the cell pitch CP is preferably equal to or less than 2 μm, more preferably equal to or less than 1.5 μm. In other words, the sum of the width of the gate trench 11 in the second direction and the distance between the adjacent gate trenches 11 in the second direction is preferably equal to or less than 2 μm, more preferably equal to or less than 1.5 μm.

From the viewpoint of improving the reliability of the gate insulating layer 15 of the MOSFET 100, it is preferable that the shape of the right connection trench 12 crossing the gate lead-out layer 16 on the first face F1 is a linear shape. In addition, from the viewpoint of improving the reliability of the gate insulating layer 15 of the MOSFET 100, it is preferable that the shape of the left connection trench 13 crossing the gate lead-out layer 16 on the first face F1 is a linear shape.

From the viewpoint of improving the reliability of the gate insulating layer 15 of the MOSFET 100, it is preferable that the side surface of the right connection trench 12 crossing the gate lead-out layer 16 is formed by the a-face or the m-face. In addition, from the viewpoint of improving the reliability of the gate insulating layer 15 of the MOSFET 100, it is preferable that the side surface of the left connection trench 13 crossing the gate lead-out layer 16 is formed by the a-face or the m-face.

From the viewpoint of improving the reliability of the gate insulating layer 15 of the MOSFET 100, it is preferable that the width of the gate lead-out layer 16 in the second direction is smaller than the cell pitch CP. In other words, it is preferable that the width of the gate lead-out layer 16 in the second direction is smaller than the sum of the width of the gate trench 11 in the second direction and the distance between the adjacent gate trenches 11 in the second direction.

As described above, according to the first embodiment, since the reliability of the gate insulating layer is improved, it is possible to realize a semiconductor device whose reliability can be improved.

Second Embodiment

A semiconductor device according to a second embodiment is different from the semiconductor device according to the first embodiment in that the semiconductor device according to the second embodiment further includes a fifth trench disposed in the silicon carbide layer, disposed on the side of the first face, extending in the first direction, disposed between the fourth trench and the second trench, and spaced from the third trench in the first direction and a sixth trench disposed in the silicon carbide layer, disposed on the side of the first face, extending in the second direction, continuous with the fourth trench and the fifth trench, and spaced from the third trench in the first direction. Hereinafter, the description of a part of the content overlapping the first embodiment may be omitted.

The semiconductor device according to the second embodiment is a trench gate type vertical MOSFET using silicon carbide. The MOSFET according to the second embodiment is an n-channel MOSFET having electrons as carriers.

Figure 8:
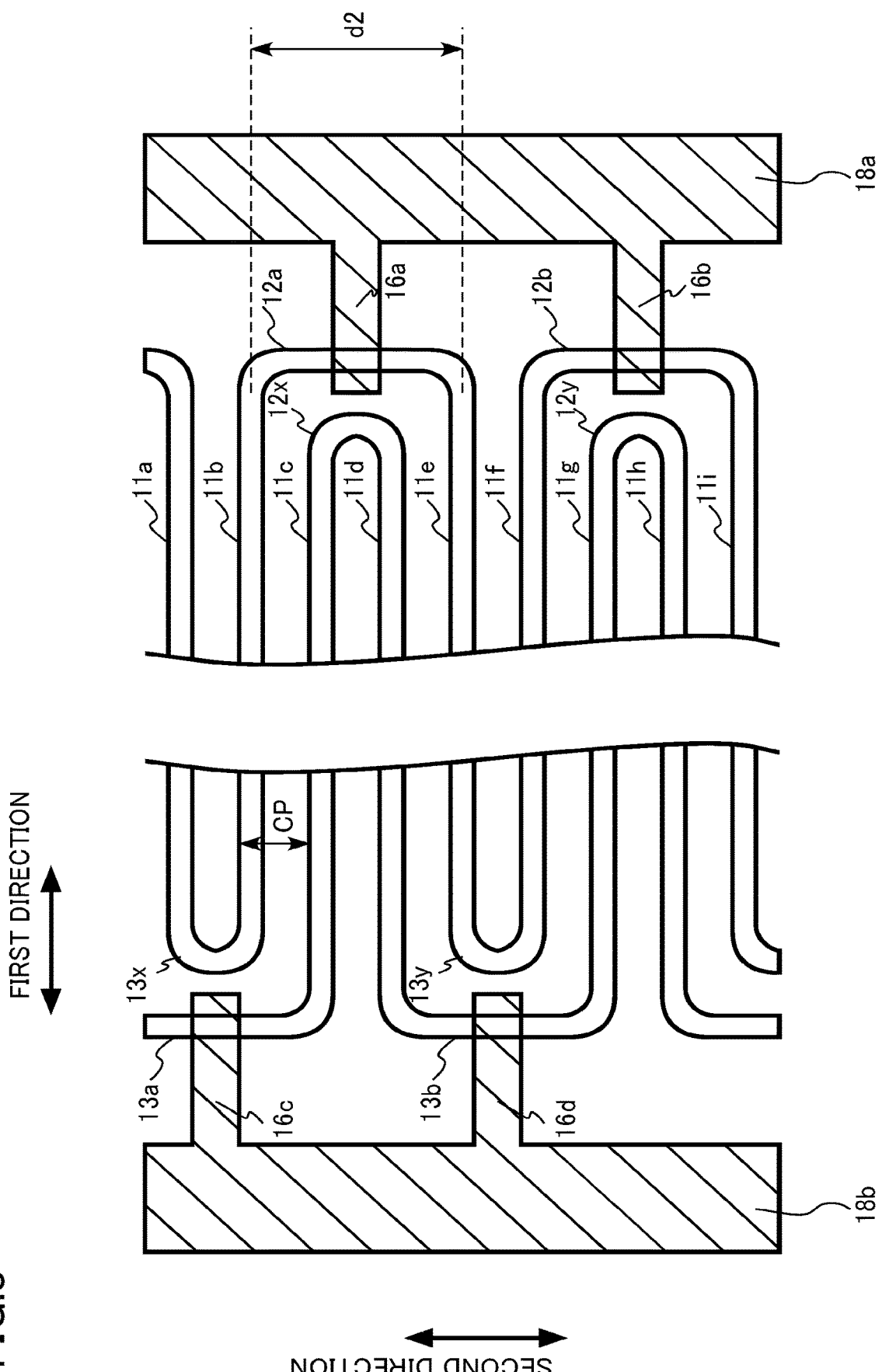
FIG. 8 is a schematic plan view of a part of a semiconductor device according to a second embodiment.

FIG. 8 is a schematic plan view of a part of the semiconductor device according to the second embodiment. FIG. 8 is a diagram corresponding to FIG. 2 of the first embodiment.

The semiconductor device according to the second embodiment includes a first gate trench 11a, a second gate trench 11b (first trench), a third gate trench 11c (fourth trench), a fourth gate trench 11d (fifth trench), a fifth gate trench 11e (second trench), a sixth gate trench 11f, a seventh gate trench 11g, an eighth gate trench 11h, a ninth gate trench 11i, a first right connection trench 12a (third trench), a second right connection trench 12b, a third right connection trench 12x (sixth trench), a fourth right connection trench 12y, a first left connection trench 13a, a second left connection trench 13b, a third left connection trench 13x, a fourth left connection trench 13y, a gate electrode 14, a gate insulating layer 15, a first gate lead-out layer 16a (first conductive layer), a second gate lead-out layer 16b, a third gate lead-out layer 16c, a fourth gate lead-out layer 16d, a first gate wiring layer 18a, and a second gate wiring layer 18b.

In the MOSFET according to the second embodiment, the first right connection trench 12a (third trench) connects the end of the second gate trench 11b (first trench) and the end of the fifth gate trench 11e (second trench) to each other.

In the MOSFET according to the second embodiment, two gate trenches 11 are provided between the two gate trenches 11 connected to each other by the right connection trench 12.

For example, the first right connection trench 12a (third trench) is continuous with the second gate trench 11b (first trench) and the fifth gate trench 11e (second trench). The first right connection trench 12a connects the second gate trench 11b and the fifth gate trench 11e to each other.

The third gate trench 11c (fourth trench) and the fourth gate trench 11d (fifth trench) are disposed between the second gate trench 11b and the fifth gate trench 11e. The third right connection trench 12x (sixth trench) is continuous with the third gate trench 11c and the fourth gate trench 11d. The third right connection trench 12x extends in the second direction. The third right connection trench 12x connects the third gate trench 11c and the fourth gate trench 11d to each other. The third right connection trench 12x (sixth trench) is spaced from the first right connection trench 12a (third trench) in the first direction.

The length of the right connection trench 12 crossing the gate lead-out layer 16 in the second direction is three times the cell pitch CP. For example, the length (d2 in FIG. 8) of the first right connection trench 12a (third trench) in the second direction is three times the cell pitch CP.

In addition, the third gate lead-out layer 16c and the fourth gate lead-out layer 16d connected to the second gate wiring layer 18b are arranged so as to be shifted by twice the cell pitch CP in the second direction with respect to the first gate lead-out layer 16a and the second gate lead-out layer 16b connected to the first gate wiring layer 18a.

In the MOSFET according to the second embodiment, two other gate trenches 11 are disposed between the two gate trenches 11 connected to each other. In the MOSFET according to the second embodiment, the length of the right connection trench 12 crossing the gate lead-out layer 16 in the second direction and the length of the left connection trench 13 crossing the gate lead-out layer 16 in the second direction are three times the cell pitch CP. Therefore, the gate lead-out layer 16 and the corner where the gate trench 11 and the right connection trench 12 cross each other are more difficult to cross each other, as compared with the MOSFET according to the first embodiment. Therefore, the reliability of the gate insulating layer 15 is improved. In addition, by reducing the cell pitch CP, the on-resistance of the MOSFET can be reduced.

Modification Example

Figure 9:
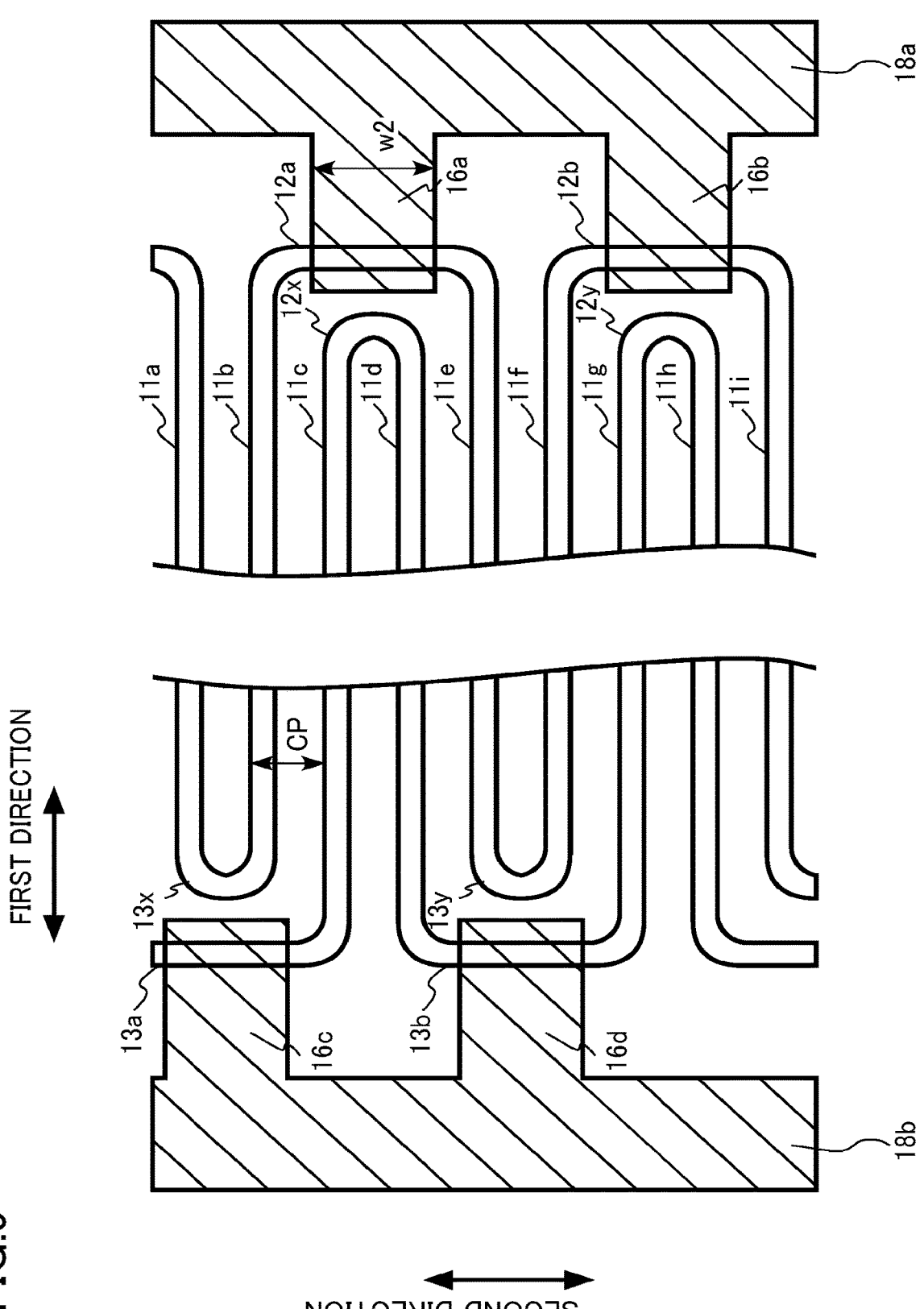
FIG. 9 is a schematic plan view of a part of a semiconductor device of a modification example of the second embodiment.

FIG. 9 is a schematic plan view of a part of a semiconductor device of a modification example of the second embodiment. FIG. 9 is a diagram corresponding to FIG. 8 of the second embodiment.

In the MOSFET of the modification example, the width of the gate lead-out layer 16 in the second direction is larger than that in the MOSFET according to the second embodiment. For example, the width (w2 in FIG. 9) of the first gate lead-out layer 16a in the second direction is larger than that in the MOSFET according to the second embodiment. The width of the gate lead-out layer 16 in the second direction is larger than, for example, the cell pitch CP.

As described above, according to the second embodiment and the modification example, since the reliability of the gate insulating layer is improved, it is possible to realize a semiconductor device whose reliability can be improved.

Third Embodiment

A semiconductor device according to a third embodiment is different from the semiconductor device according to the second embodiment in that the gate lead-out layer connected to the second gate wiring layer is arranged so as to be shifted by the cell pitch CP in the second direction with respect to the gate lead-out layer connected to the first gate wiring layer. Hereinafter, the description of a part of the content overlapping the second embodiment may be omitted.

The semiconductor device according to the third embodiment is a trench gate type vertical MOSFET using silicon carbide. The MOSFET according to the third embodiment is an n-channel MOSFET having electrons as carriers.

Figure 10:
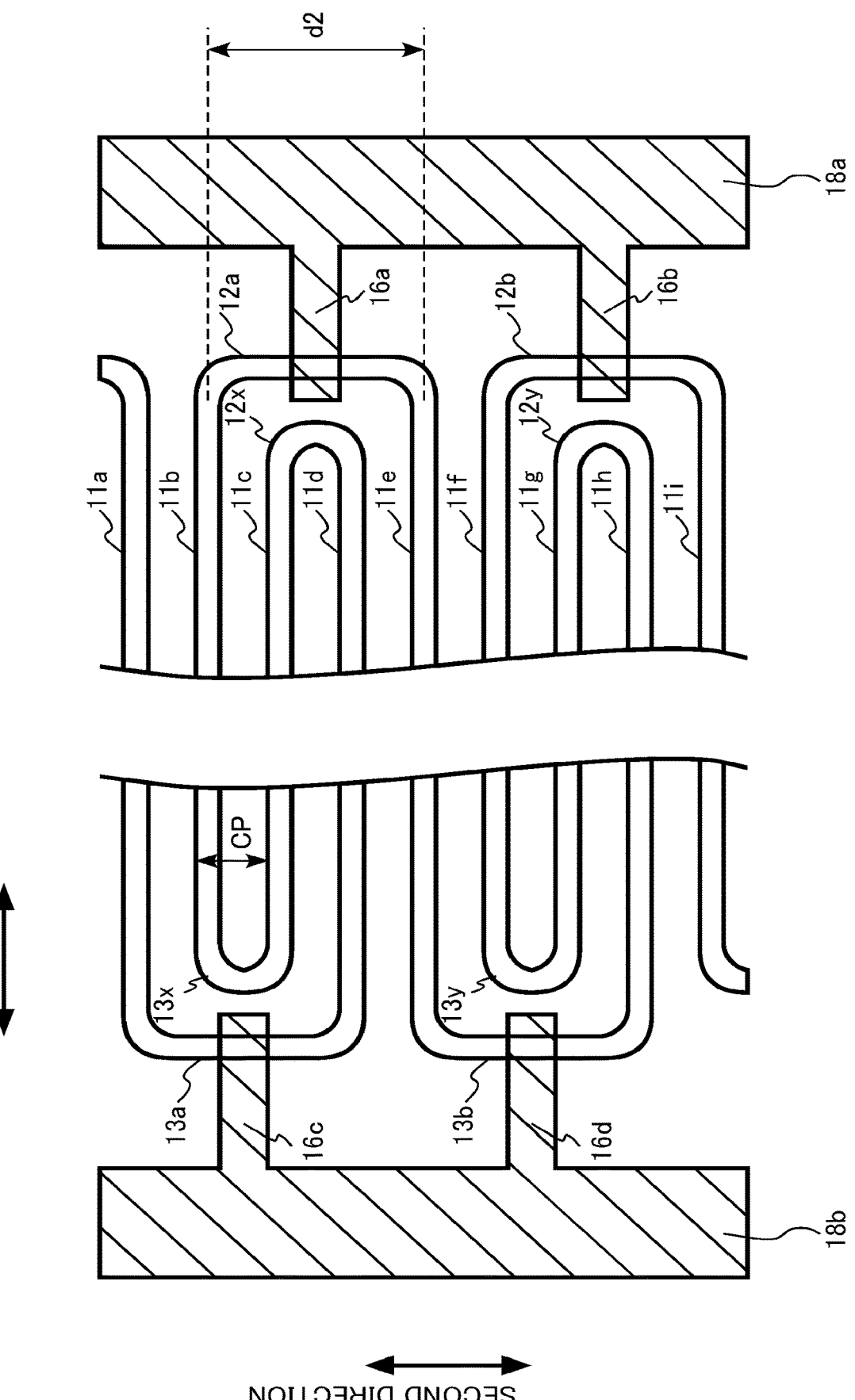
FIG. 10 is a schematic plan view of a part of a semiconductor device according to a third embodiment.

FIG. 10 is a schematic plan view of a part of the semiconductor device according to the third embodiment. FIG. 10 is a diagram corresponding to FIG. 8 of the second embodiment.

The third gate lead-out layer 16c and the fourth gate lead-out layer 16d connected to the second gate wiring layer 18b are arranged so as to be shifted by the cell pitch CP in the second direction with respect to the first gate lead-out layer 16a and the second gate lead-out layer 16b connected to the first gate wiring layer 18a.

As described above, according to the third embodiment, since the reliability of the gate insulating layer is improved, it is possible to realize a semiconductor device whose reliability can be improved.

Fourth Embodiment

A semiconductor device according to a fourth embodiment is different from the semiconductor device according to the first embodiment in that three other gate trenches are disposed between two gate trenches connected to each other. Hereinafter, the description of a part of the content overlapping the first embodiment may be omitted.

The semiconductor device according to the fourth embodiment is a trench gate type vertical MOSFET using silicon carbide. The MOSFET according to the fourth embodiment is an n-channel MOSFET having electrons as carriers.

Figure 11:
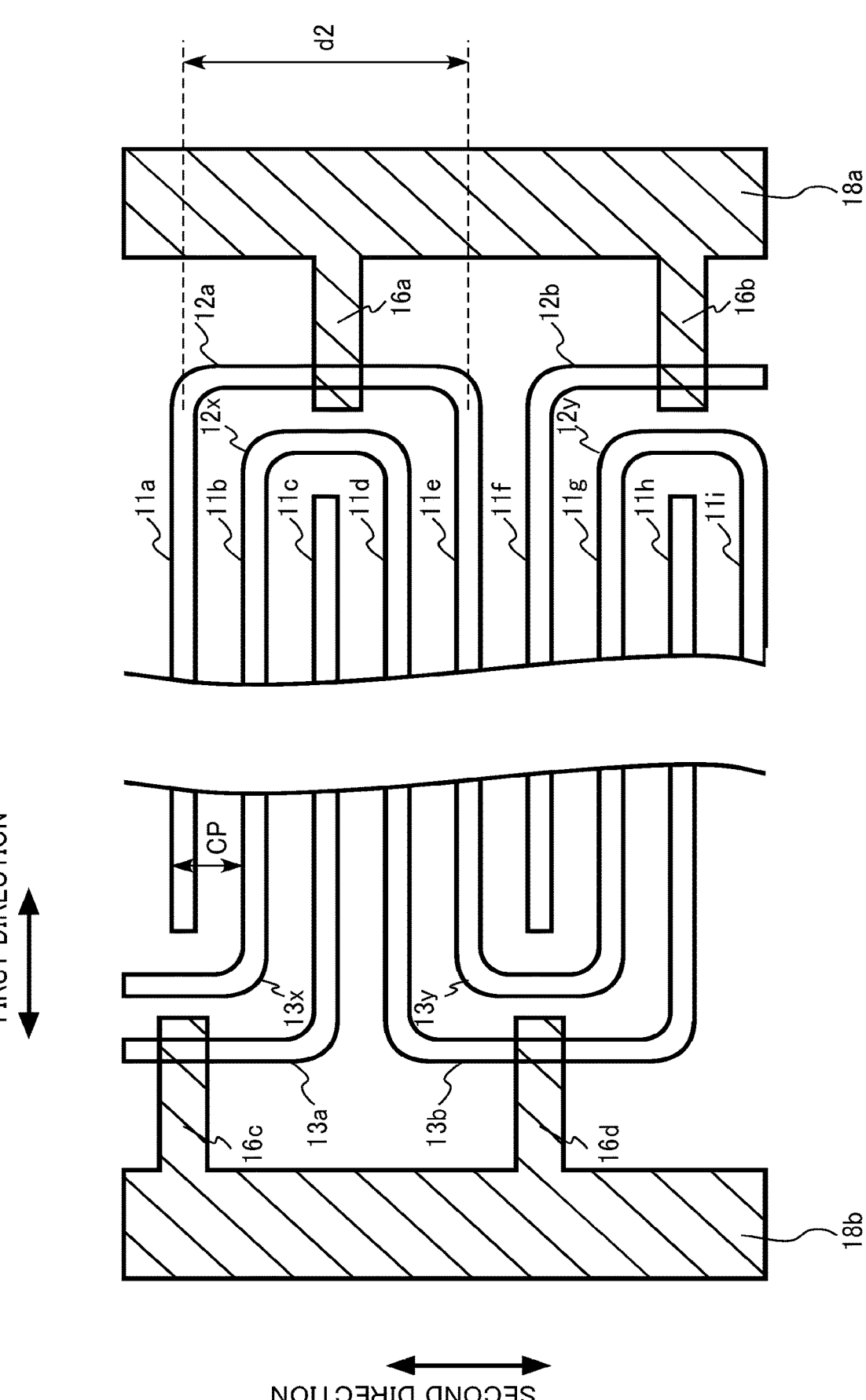
FIG. 11 is a schematic plan view of a part of a semiconductor device according to a fourth embodiment.

FIG. 11 is a schematic plan view of a part of the semiconductor device according to the fourth embodiment. FIG. 11 is a diagram corresponding to FIG. 2 of the first embodiment.

The semiconductor device according to the fourth embodiment includes a first gate trench 11a (first trench), a second gate trench 11b (fourth trench), a third gate trench 11c, a fourth gate trench 11d (fifth trench), a fifth gate trench 11e (second trench), a sixth gate trench 11f, a seventh gate trench 11g, an eighth gate trench 11h, a ninth gate trench 11i, a first right connection trench 12a (third trench), a second right connection trench 12b, a third right connection trench 12x (sixth trench), a fourth right connection trench 12y, a first left connection trench 13a, a second left connection trench 13b, a third left connection trench 13x, a fourth left connection trench 13y, a gate electrode 14, a gate insulating layer 15, a first gate lead-out layer 16a (first conductive layer), a second gate lead-out layer 16b, a third gate lead-out layer 16c, a fourth gate lead-out layer 16d, a first gate wiring layer 18a, and a second gate wiring layer 18b.

In the MOSFET according to the fourth embodiment, the first right connection trench 12a (third trench) is continuous with the first gate trench 11a (first trench) and the fifth gate trench 11e (second trench). The first right connection trench 12a (third trench) connects the end of the first gate trench 11a (first trench) and the end of the fifth gate trench 11e (second trench) to each other.

In the MOSFET according to the fourth embodiment, three gate trenches 11 are provided between the two gate trenches 11 connected to each other by the right connection trench 12.

For example, the second gate trench 11b (fourth trench), the third gate trench 11c, and the fourth gate trench 11d (fifth trench) are disposed between the first gate trench 11a and the fifth gate trench 11e. The third right connection trench 12x (sixth trench) is continuous with the second gate trench 11b and the fourth gate trench 11d. The third right connection trench 12x connects the second gate trench 11b and the fourth gate trench 11d to each other. The third right connection trench 12x is spaced from the first right connection trench 12a (third trench) in the first direction.

The length of the right connection trench 12 crossing the gate lead-out layer 16 in the second direction is four times the cell pitch CP. For example, the length (d2 in FIG. 11) of the first right connection trench 12a (third trench) in the second direction is four times the cell pitch CP.

In addition, the third gate lead-out layer 16c and the fourth gate lead-out layer 16d connected to the second gate wiring layer 18b are arranged so as to be shifted by twice the cell pitch CP in the second direction with respect to the first gate lead-out layer 16a and the second gate lead-out layer 16b connected to the first gate wiring layer 18a.

In the MOSFET according to the fourth embodiment, three other gate trenches 11 are disposed between the two gate trenches 11 connected to each other. In the MOSFET according to the fourth embodiment, the length of the right connection trench 12 crossing the gate lead-out layer 16 in the second direction and the length of the left connection trench 13 crossing the gate lead-out layer 16 in the second direction are four times the cell pitch CP.

Therefore, the gate lead-out layer 16 and the corner where the gate trench 11 and the right connection trench 12 cross each other are more difficult to cross each other, as compared with the MOSFET according to the first embodiment or the second embodiment. Therefore, the reliability of the gate insulating layer 15 is improved. In addition, by reducing the cell pitch CP, the on-resistance of the MOSFET can be reduced.

First Modification Example

Figure 12:
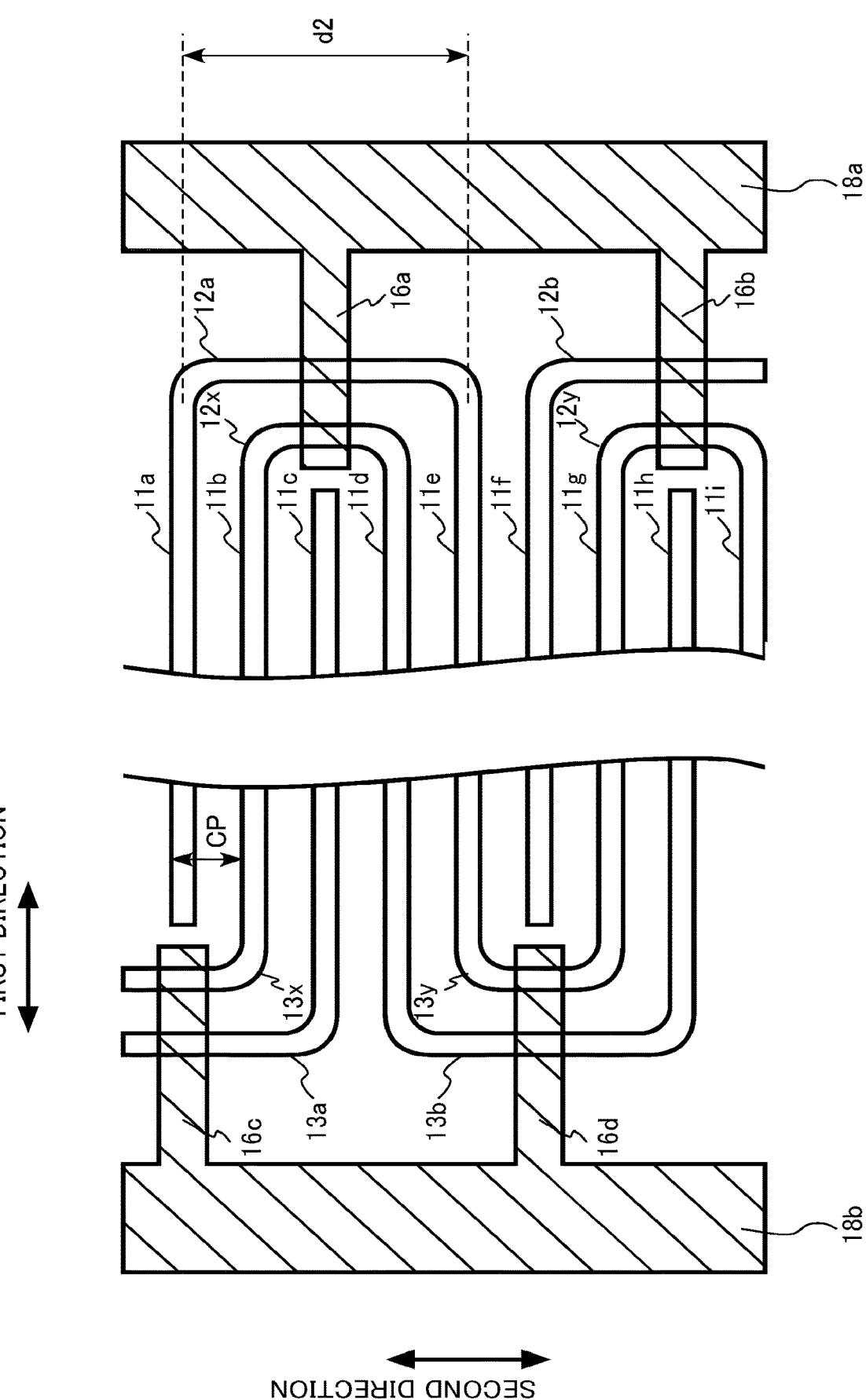
FIG. 12 is a schematic plan view of a part of a semiconductor device of a first modification example of the fourth embodiment.

FIG. 12 is a schematic plan view of a part of a semiconductor device of a first modification example of the fourth embodiment. FIG. 12 is a diagram corresponding to FIG. 11 of the fourth embodiment.

A MOSFET of the first modification example is different from the MOSFET according to the fourth embodiment in that the gate lead-out layer 16 crosses two right connection trenches 12 or two left connection trenches 13. For example, the first gate lead-out layer 16a crosses the first right connection trench 12a and the third right connection trench 12x.

Second Modification Example

Figure 13:
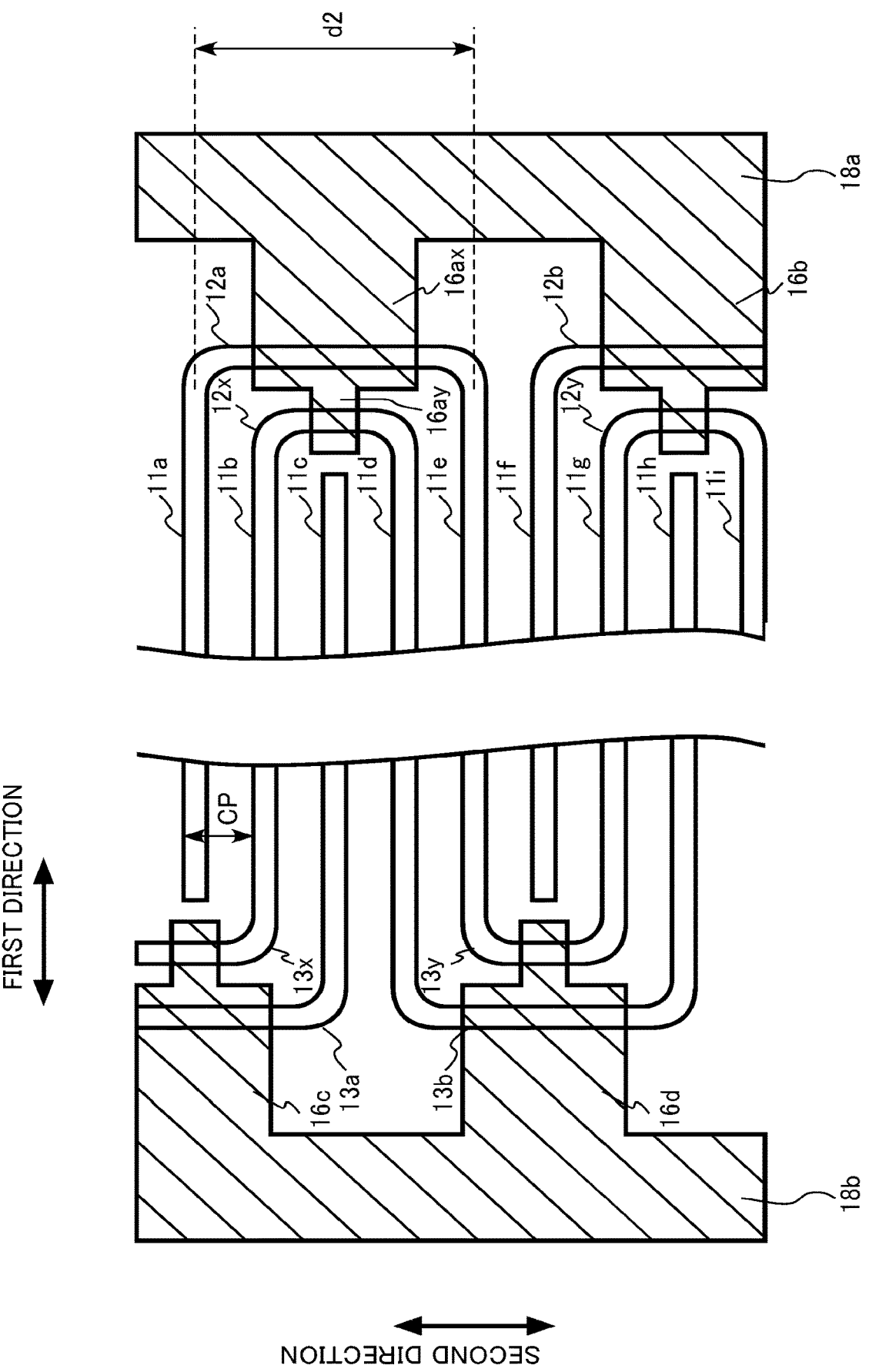
FIG. 13 is a schematic plan view of a part of a semiconductor device of a second modification example of the fourth embodiment.

FIG. 13 is a schematic plan view of a part of a semiconductor device of a second modification example of the fourth embodiment. FIG. 13 is a diagram corresponding to FIG. 11 of the fourth embodiment.

A MOSFET of the second modification example is different from the MOSFET of the first modification example in that the gate lead-out layer 16 has a wide portion and a narrow portion. For example, the first gate lead-out layer 16a has a wide portion 16ax and a narrow portion 16ay.

As described above, according to the fourth embodiment and the modification examples, since the reliability of the gate insulating layer is improved, it is possible to realize a semiconductor device whose reliability can be improved.

Fifth Embodiment

A semiconductor device according to a fifth embodiment is different from the semiconductor device according to the fourth embodiment in that the gate lead-out layer connected to the second gate wiring layer is arranged so as to be shifted by the cell pitch CP in the second direction with respect to the gate lead-out layer connected to the first gate wiring layer. Hereinafter, the description of a part of the content overlapping the fourth embodiment may be omitted.

The semiconductor device according to the fifth embodiment is a trench gate type vertical MOSFET using silicon carbide. The MOSFET according to the fifth embodiment is an n-channel MOSFET having electrons as carriers.

Figure 14:
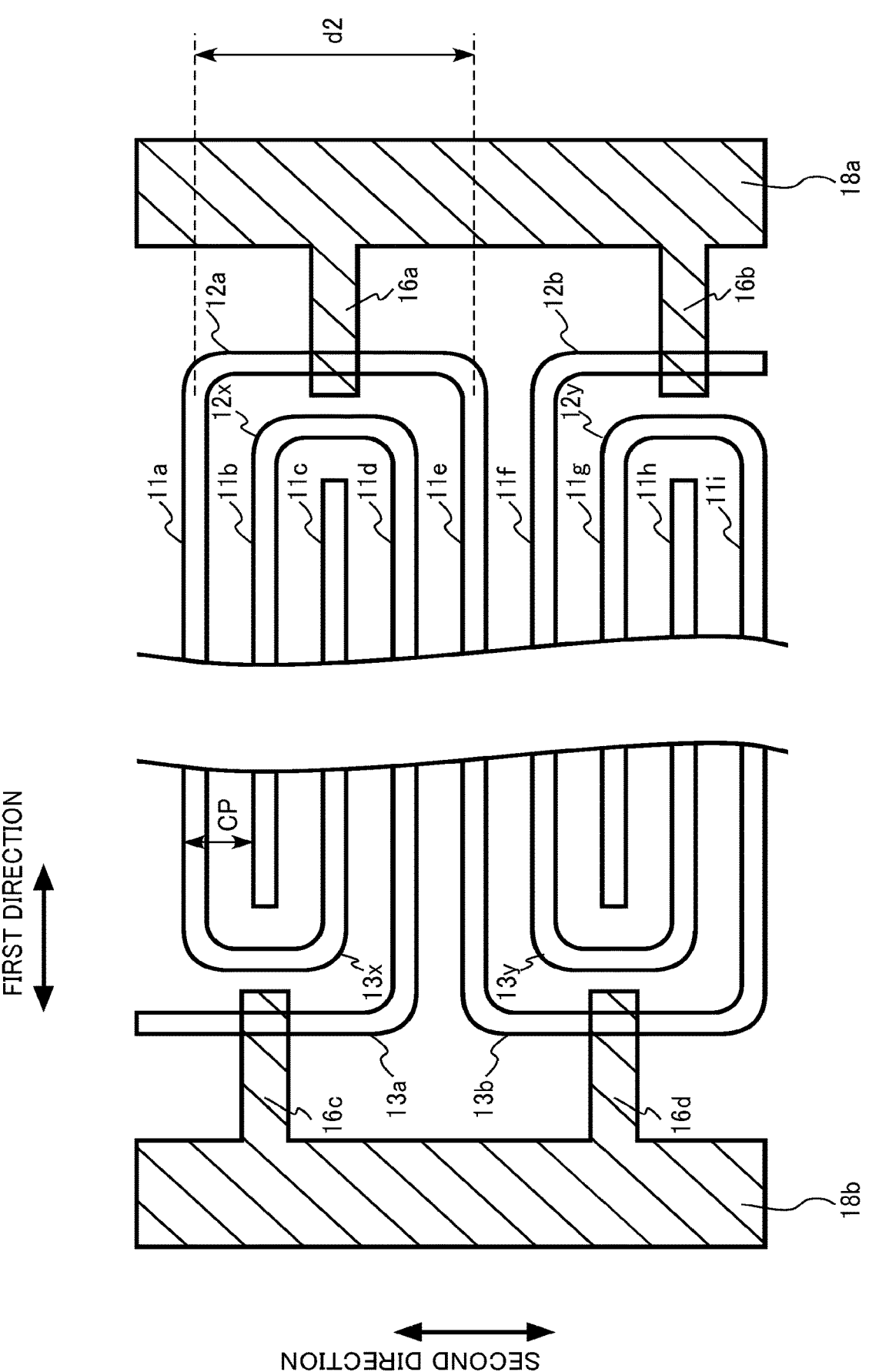
FIG. 14 is a schematic plan view of a part of a semiconductor device according to a fifth embodiment.

FIG. 14 is a schematic plan view of a part of the semiconductor device according to the fifth embodiment. FIG. 14 is a diagram corresponding to FIG. 11 of the fourth embodiment.

The third gate lead-out layer 16c and the fourth gate lead-out layer 16d connected to the second gate wiring layer 18b are arranged so as to be shifted by the cell pitch CP in the second direction with respect to the first gate lead-out layer 16a and the second gate lead-out layer 16b connected to the first gate wiring layer 18a.

As described above, according to the fifth embodiment, since the reliability of the gate insulating layer is improved, it is possible to realize a semiconductor device whose reliability can be improved.

Sixth Embodiment

An inverter circuit and a drive device according to a sixth embodiment are an inverter circuit and a drive device each including the semiconductor device according to the first embodiment.

Figure 15:
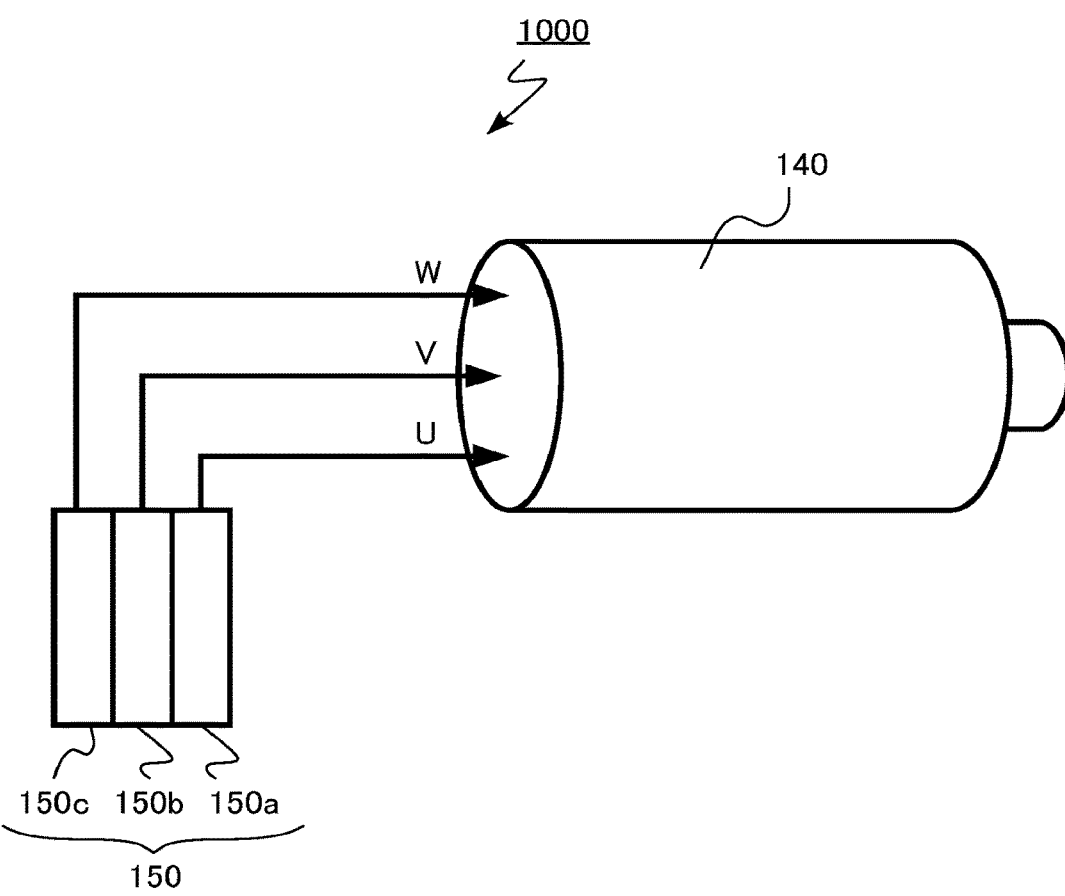
FIG. 15 is a schematic diagram of a drive device according to a sixth embodiment.

FIG. 15 is a schematic diagram of the drive device according to the sixth embodiment. A drive device 1000 includes a motor 140 and an inverter circuit 150.

The inverter circuit 150 includes three semiconductor modules 150a, 150b, and 150c having the MOSFET 100 according to the first embodiment as a switching element. By connecting the three semiconductor modules 150a, 150b, and 150c in parallel to each other, a three-phase inverter circuit 150 having three AC voltage output terminals U, V, and W is realized. The motor 140 is driven by the AC voltage output from the inverter circuit 150.

According to the sixth embodiment, the characteristics of the inverter circuit 150 and the drive device 1000 are improved by providing the MOSFET 100 with improved characteristics.

Seventh Embodiment

A vehicle according to a seventh embodiment is a vehicle including the semiconductor device according to the first embodiment.

Figure 16:
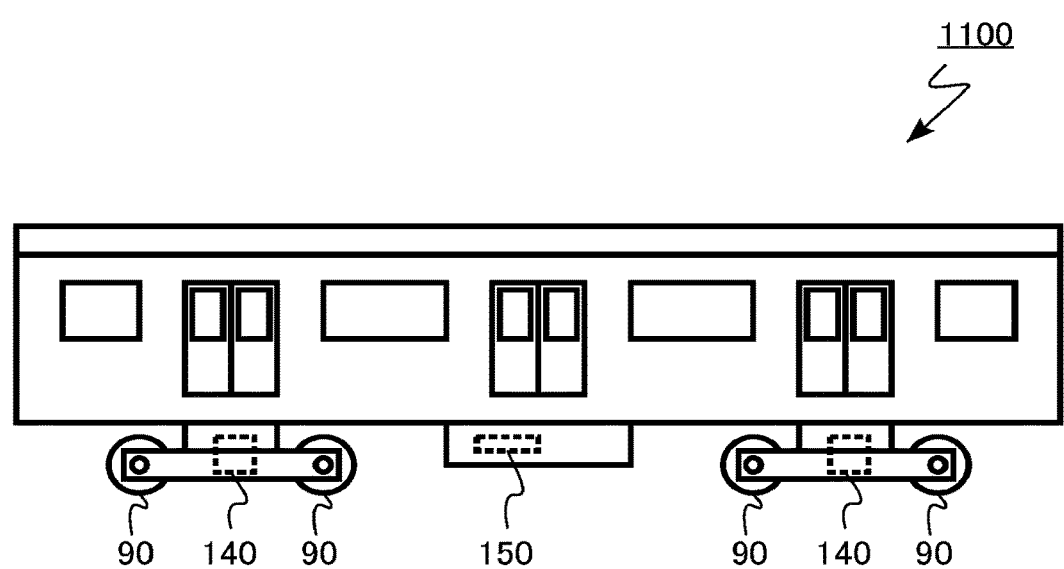
FIG. 16 is a schematic diagram of a vehicle according to a seventh embodiment.

FIG. 16 is a schematic diagram of the vehicle according to the seventh embodiment. A vehicle 1100 according to the seventh embodiment is a railroad vehicle. The vehicle 1100 includes a motor 140 and an inverter circuit 150.

The inverter circuit 150 includes three semiconductor modules having the MOSFET 100 according to the first embodiment as a switching element. By connecting the three semiconductor modules in parallel to each other, a three-phase inverter circuit 150 having three AC voltage output terminals U, V, and W is realized. The motor 140 is driven by the AC voltage output from the inverter circuit 150. The motor 140 rotates wheels 90 of the vehicle 1100.

According to the seventh embodiment, the characteristics of the vehicle 1100 are improved by providing the MOSFET 100 with improved characteristics.

Eighth Embodiment

A vehicle according to an eighth embodiment is a vehicle including the semiconductor device according to the first embodiment.

Figure 17:
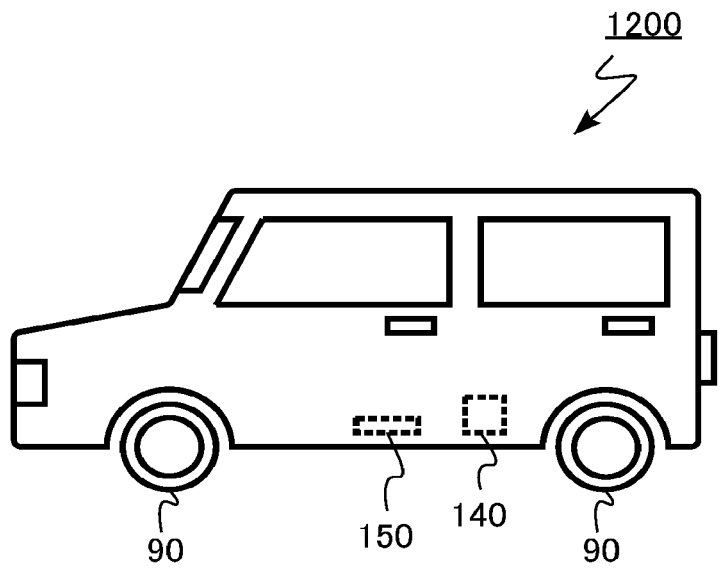
FIG. 17 is a schematic diagram of a vehicle according to an eighth embodiment.

FIG. 17 is a schematic diagram of the vehicle according to the eighth embodiment. A vehicle 1200 according to the eighth embodiment is an automobile. The vehicle 1200 includes a motor 140 and an inverter circuit 150.

The inverter circuit 150 includes three semiconductor modules having the MOSFET 100 according to the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The motor 140 rotates wheels 90 of the vehicle 1200.

According to the eighth embodiment, the characteristics of the vehicle 1200 are improved by providing the MOSFET 100 with improved characteristics.

Ninth Embodiment

An elevator according to a ninth embodiment is an elevator including the semiconductor device according to the first embodiment.

Figure 18:
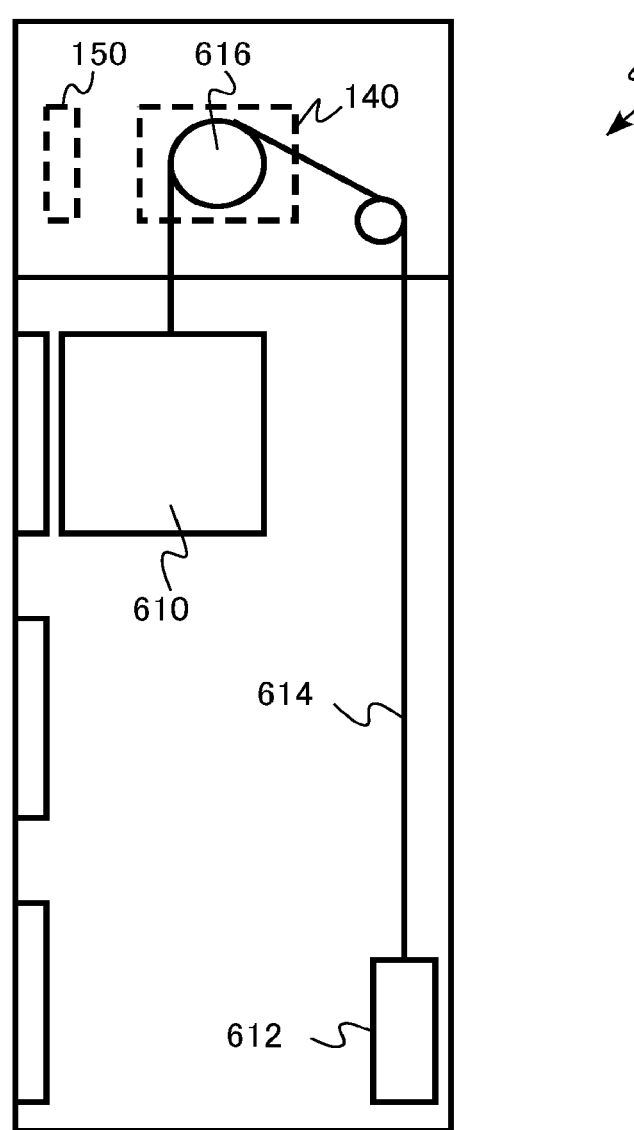
FIG. 18 is a schematic diagram of an elevator according to a ninth embodiment.

FIG. 18 is a schematic diagram of the elevator according to the ninth embodiment. An elevator 1300 according to the ninth embodiment includes a car 610, a counterweight 612, a wire rope 614, a hoisting machine 616, a motor 140, and an inverter circuit 150.

The inverter circuit 150 includes three semiconductor modules having the MOSFET 100 according to the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the ninth embodiment, the characteristics of the elevator 1300 are improved by providing the MOSFET 100 with improved characteristics.

In the first to fifth embodiments, the case of 4H-SiC has been described as an example of the crystal structure of silicon carbide. However, the embodiments can also be applied to silicon carbide having other crystal structures, such as 6H-SiC and 3C-SiC.

In the first to fifth embodiments, a MOSFET has been described as an example of the semiconductor device. However, embodiments can also be applied to an Insulated Gate Bipolar Transistor (IGBT). For example, the IGBT can be realized by replacing a region corresponding to the drain region 50 of the MOSFET 100 from the n type to the p type.

In addition, in the sixth to ninth embodiments, the cases where the semiconductor device according to the first embodiment is provided have been described as examples. However, the semiconductor devices according to the second to fifth embodiments can also be applied.

In addition, in the sixth to ninth embodiments, the cases where the semiconductor devices of embodiments are applied to a vehicle or an elevator have been described as examples. However, the semiconductor devices of embodiments can also be applied to, for example, a power conditioner of a photovoltaic power generation system.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a silicon carbide layer having a first face parallel to a first direction and a second direction crossing the first direction and a second face facing away from the first face;
a first trench disposed in the silicon carbide layer, disposed on a side of the first face, and extending in the first direction;
a second trench disposed in the silicon carbide layer, disposed on the side of the first face, extending in the first direction, and disposed in the second direction with respect to the first trench;
a third trench disposed in the silicon carbide layer, disposed on the side of the first face, extending in the second direction, and continuous with the first trench and the second trench;
a fourth trench disposed in the silicon carbide layer, disposed on the side of the first face, extending in the first direction, disposed between the first trench and the second trench, and spaced from the third trench in the first direction;
a fifth trench disposed in the silicon carbide layer, disposed on the side of the first face, extending in the first direction, disposed between the fourth trench and the second trench, and spaced from the third trench in the first direction;
a sixth trench disposed in the silicon carbide layer, disposed on the side of the first face, extending in the second direction, continuous with the fourth trench and the fifth trench, and spaced from the third trench in the first direction;
an eighth trench disposed in the silicon carbide layer, disposed on the side of the first face, extending in the second direction, continuous with the fourth trench, and spaced from the first trench in the first direction;
a first silicon carbide region of n-type disposed in the silicon carbide layer;
a second silicon carbide region of p-type disposed in the silicon carbide layer and disposed between the first silicon carbide region and the first face, a distance of the second silicon carbide region from the second face being larger than a distance from the second face to the first trench;
a third silicon carbide region of n-type disposed in the silicon carbide layer and disposed between the second silicon carbide region and the first face;
a gate electrode disposed in the first trench, the second trench, the third trench, the fourth trench, the fifth trench, the sixth trench, and the eighth trench;
a gate insulating layer disposed between the gate electrode and the silicon carbide layer;
a first wiring layer disposed on the side of the first face with respect to the silicon carbide layer, disposed in the first direction with respect to the third trench, and extending in the second direction;
a first conductive layer crossing the third trench, connected to the gate electrode, and is electrically connected to the first wiring layer;
a second wiring layer disposed on the side of the first face with respect to the silicon carbide layer, disposed in the first direction with respect to the eighth trench, and extending in the second direction;
a second conductive layer crossing the eighth trench, connected to the gate electrode, and electrically connected to the second wiring layer;
a first electrode disposed on the side of the first face with respect to the silicon carbide layer and electrically connected to the third silicon carbide region; and
a second electrode disposed on a side of the second face with respect to the silicon carbide layer, wherein
the first conductive layer is disposed between the gate electrode and the first wiring layer, and the first conductive layer is in direct contact with the gate electrode and the first wiring layer,
the first conductive layer is in direct contact with the gate electrode at a position where the first conductive layer crosses the third trench,
a distance between the sixth trench and the first wiring layer in the first direction is smaller than a distance between the sixth trench and the second wiring layer in the first direction,
a distance between the third trench and the first wiring layer in the first direction is smaller than a distance between the third trench and the second wiring layer in the first direction,
the sixth trench is spaced from the third trench in the first direction, and
a distance between the eighth trench and the second wiring layer in the first direction is smaller than a distance between the eighth trench and the first wiring layer in the first direction.

2. The semiconductor device according to claim 1, wherein the gate electrode, the first wiring layer, and the first conductive layer contain a same material.

3. The semiconductor device according to claim 2, wherein the same material is polycrystalline silicon.

4. The semiconductor device according to claim 1, wherein the gate insulating layer is disposed between the first conductive layer and the silicon carbide layer.

5. The semiconductor device according to claim 1, wherein a shape of the third trench crossing the first conductive layer on the first face is a linear shape.

6. The semiconductor device according to claim 1, wherein a side surface of the third trench crossing the first conductive layer is formed by an a-face or an m-face.

7. The semiconductor device according to claim 1, wherein a sum of a width of the first trench in the second direction and a distance between the first trench and the fourth trench in the second direction is equal to or less than 2 μm.

8. An inverter circuit, comprising: the semiconductor device according to claim 1.

9. A drive device, comprising: the semiconductor device according to claim 1.

10. A vehicle, comprising: the semiconductor device according to claim 1.

11. An elevator, comprising: the semiconductor device according to claim 1.

12. The semiconductor device according to claim 1, further comprising:

a ninth trench disposed in the silicon carbide layer, disposed on the side of the first face, extending in the second direction, continuous with the second trench, and spaced from the third trench in the first direction; and a tenth trench disposed in the silicon carbide layer, disposed on the side of the first face, extending in the first direction, and continuous with the ninth trench, wherein the second trench is disposed between the tenth trench and the fifth trench.

13. The semiconductor device according to claim 12, further comprising:

an eleventh trench disposed in the silicon carbide layer, disposed on the side of the first face, extending in the second direction, continuous with the tenth trench, and spaced from the third trench in the second direction.

14. The semiconductor device according to claim 13, further comprising:

a third conductive layer crossing the eleventh trench, connected to the gate electrode, and electrically connected to the first wiring layer.

15. The semiconductor device according to claim 14, further comprising:

a twelfth trench disposed in the silicon carbide layer, disposed on the side of the first face, and extending in the second direction, continuous with the fifth trench, wherein a distance between the twelfth trench and the second wiring layer in the first direction is smaller than a distance between the twelfth trench and the first wiring layer in the first direction.

16. The semiconductor device according to claim 15, further comprising:

a fourth conductive layer crossing the twelfth trench, connected to the gate electrode, and electrically connected to the second wiring layer.

17. The semiconductor device according to claim 1, wherein a width of the first conductive layer in the second direction is larger than a cell pitch.

18. The semiconductor device according to claim 1, wherein the fourth trench and the fifth trench are neighboring to each other in the second direction without intervening any other trenches.

* * * * *